United States Patent
Chu et al.

(10) Patent No.: US 9,583,481 B2
(45) Date of Patent: Feb. 28, 2017

(54) SEMICONDUCTOR DEVICE COMPRISING PLURALITY OF CONDUCTIVE PORTIONS DISPOSED WITHIN WELLS AND A NANOWIRE COUPLED TO CONDUCTIVE PORTION

(71) Applicant: Taiwan Semiconductor Manufacturing Company Limited, Hsin-Chu (TW)

(72) Inventors: Li-Wei Chu, Hsinchu (TW); Bo-Ting Chen, Fengyuan (TW); Wun-Jie Lin, Hsinchu (TW); Han-Jen Yang, Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/501,162

(22) Filed: Sep. 30, 2014

(65) Prior Publication Data

US 2016/0093608 A1    Mar. 31, 2016

(51) Int. Cl.
| | |
|---|---|
| H01L 27/06 | (2006.01) |
| H01L 27/02 | (2006.01) |
| H01L 29/423 | (2006.01) |
| H01L 29/786 | (2006.01) |
| H01L 23/50 | (2006.01) |
| H01L 27/088 | (2006.01) |
| H01L 29/06 | (2006.01) |

(52) U.S. Cl.
CPC ......... *H01L 27/0629* (2013.01); *H01L 23/50* (2013.01); *H01L 27/0248* (2013.01); *H01L 27/088* (2013.01); *H01L 29/0649* (2013.01); *H01L 29/0676* (2013.01); *H01L 29/42392* (2013.01); *H01L 29/78642* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,550,699 A | * | 8/1996 | Diaz | ................ H02H 9/046 361/111 |
| 7,714,356 B2 | | 5/2010 | Abou-Khalil et al. | |
| 2011/0266624 A1 | * | 11/2011 | Duvvury | ............. H01L 27/0262 257/360 |

(Continued)

FOREIGN PATENT DOCUMENTS

WO    2013044096 A2    3/2013

*Primary Examiner* — Shaun Campbell
*Assistant Examiner* — Aneta Cieslewicz
(74) *Attorney, Agent, or Firm* — Cooper Legal Group, LLC

(57) ABSTRACT

A semiconductor device is provided. The semiconductor device includes a first conductive portion on a first side of a first shallow trench isolation (STI) region. The first conductive portion is formed within a first well having a first conductivity type. The first conductive portion has the first conductivity type. The first conductive portion is connected to an electro static discharge (ESD) circuit. A second conductive portion is on a second side of the first STI region. The second conductive portion is formed within a second well having a second conductivity type. The second conductive portion having the first conductivity type is connected to a first nanowire and an input output I/O port.

20 Claims, 12 Drawing Sheets

(56) References Cited

U.S. PATENT DOCUMENTS

2012/0037953 A1* 2/2012 Hayano ............. H01L 21/82388
  257/133
2012/0319201 A1* 12/2012 Sun ................... H01L 21/82348
  257/338
2013/0161733 A1* 6/2013 Hayano ............... H01L 27/0629
  257/329

* cited by examiner

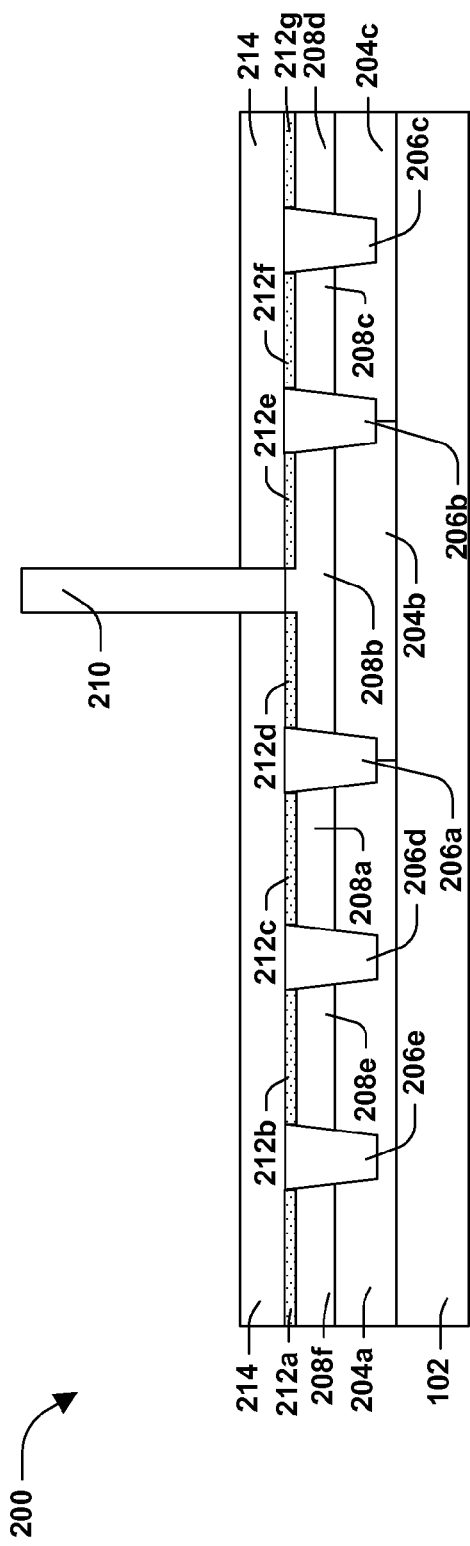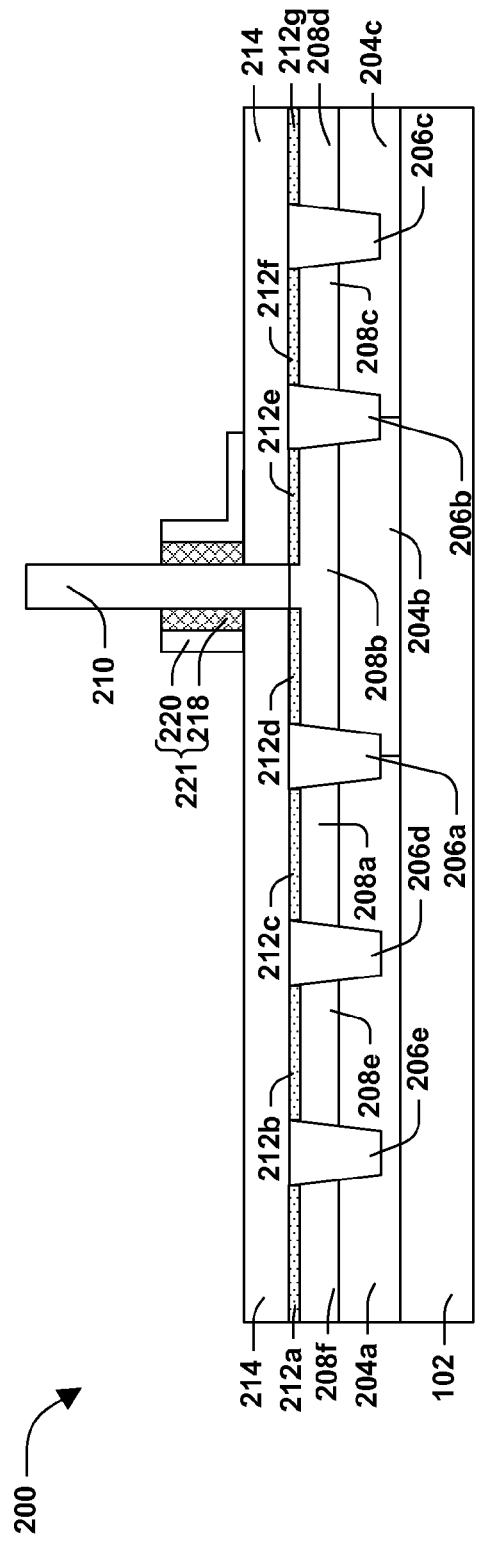

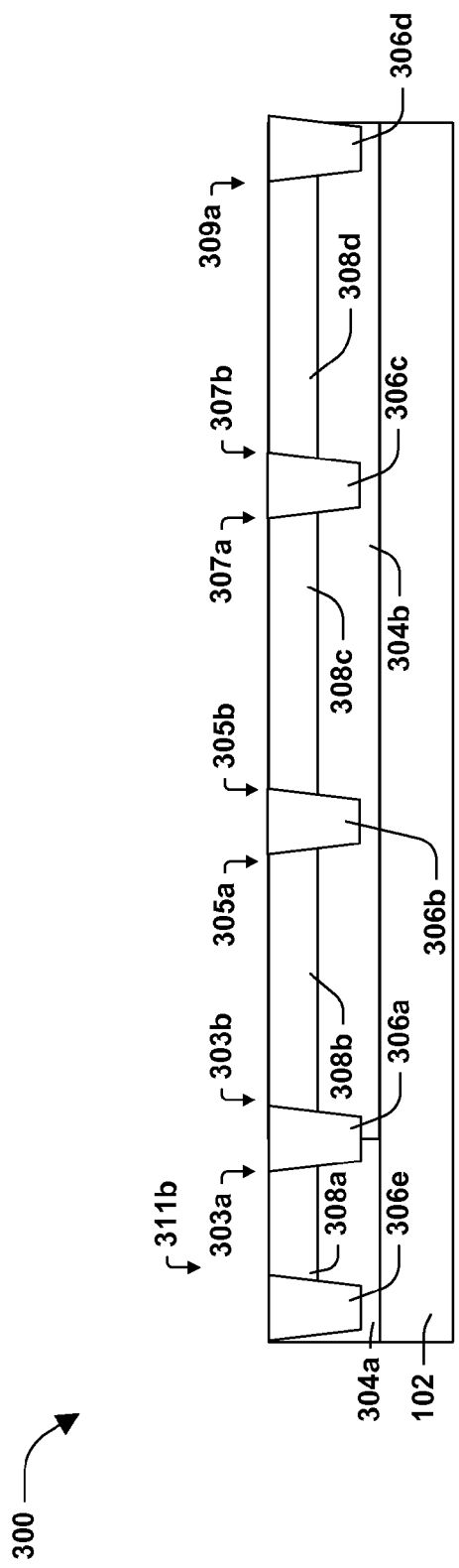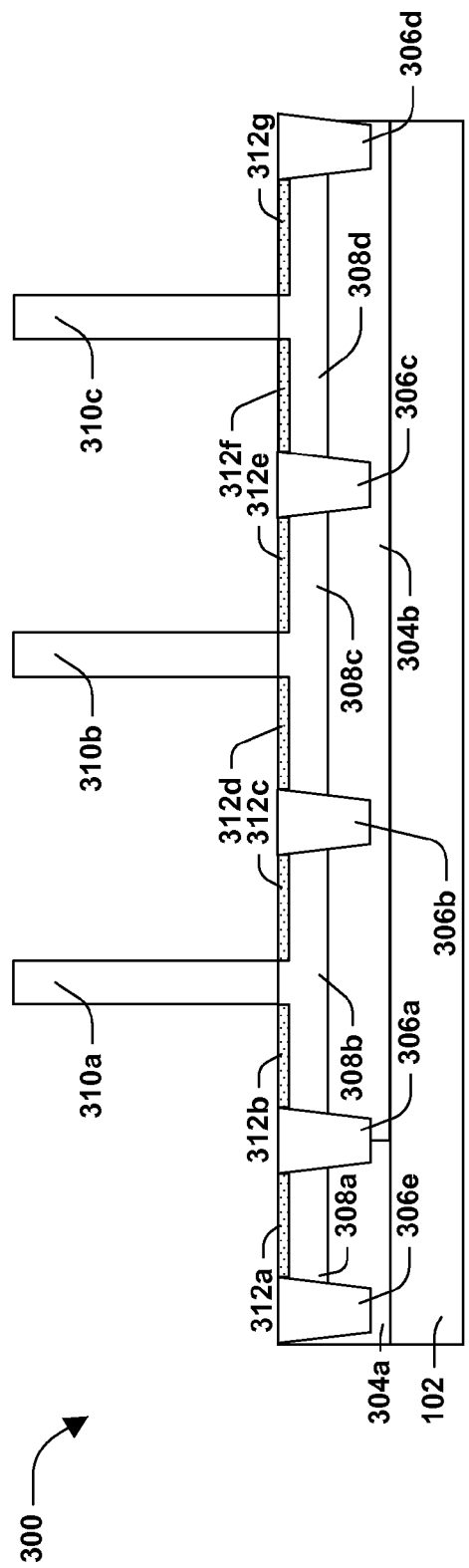

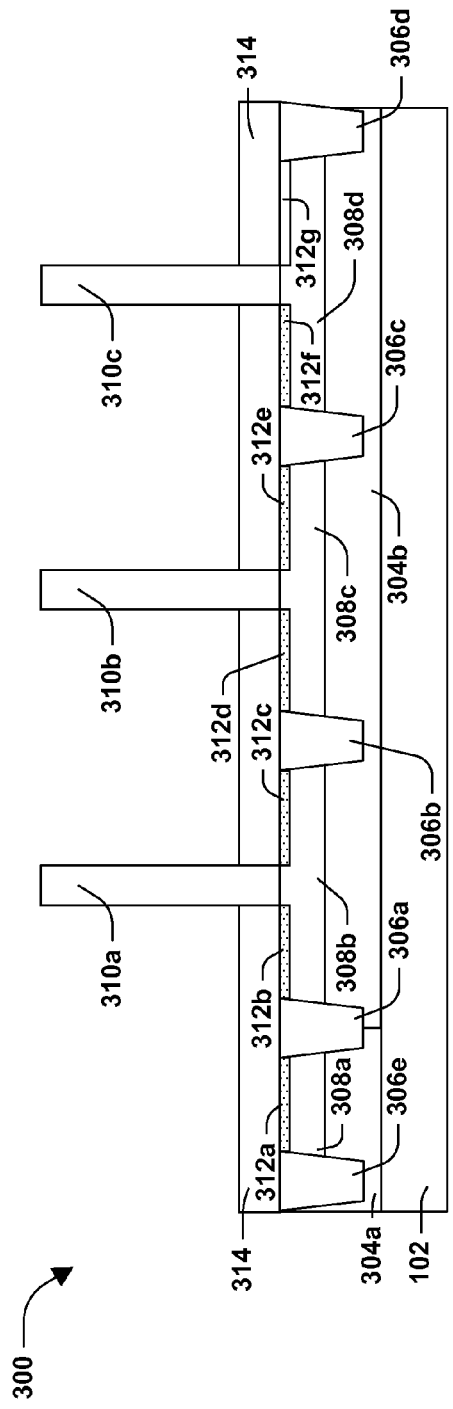
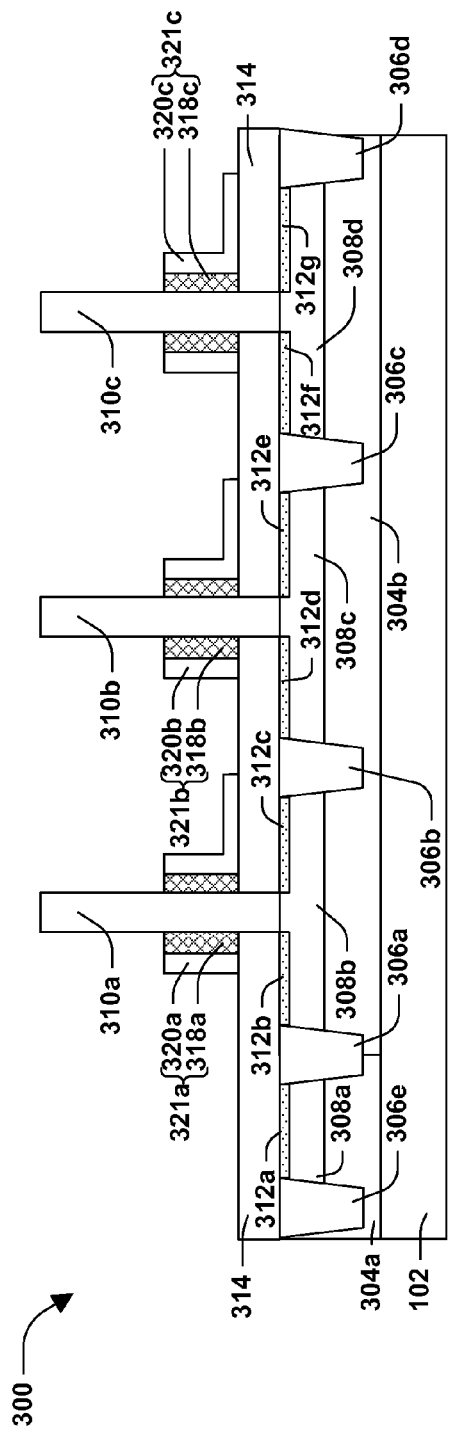

SEMICONDUCTOR DEVICE COMPRISING PLURALITY OF CONDUCTIVE PORTIONS DISPOSED WITHIN WELLS AND A NANOWIRE COUPLED TO CONDUCTIVE PORTION

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is an illustration of a semiconductor device at a stage of fabrication, in accordance with some embodiments.

FIG. 12 is an illustration of a semiconductor device at a stage of fabrication, in accordance with some embodiments.

FIG. 16 is an illustration of a semiconductor device at a stage of fabrication, in accordance with some embodiments.

FIG. 17 is an illustration of a semiconductor device at a stage of fabrication, in accordance with some embodiments.

FIG. 18 is an illustration of a semiconductor device at a stage of fabrication, in accordance with some embodiments.

FIG. 19 is an illustration of a semiconductor device at a stage of fabrication, in accordance with some embodiments.

DETAILED DESCRIPTION

Figure 1:
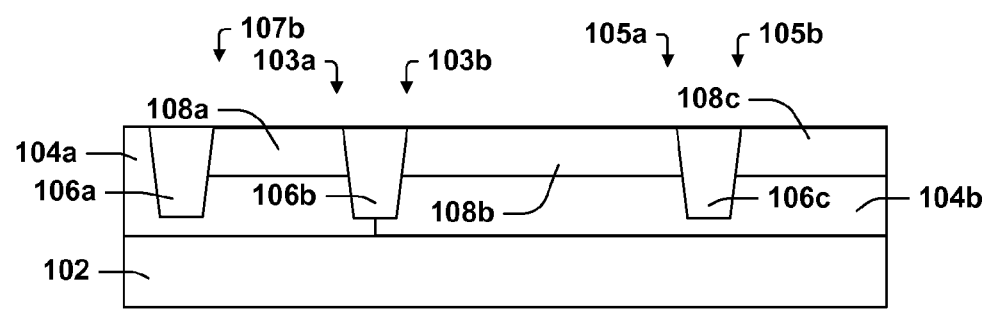
FIG. 1 is an illustration of a semiconductor device at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

According to some embodiments, a semiconductor device comprises a first conductive portion on a first side of a first shallow trench isolation (STI) region. In some embodiments, the first conductive portion is formed within a first well. In some embodiments, the first well has a first conductivity type. In some embodiments, the first conductive portion has the first conductivity type. In some embodiments, the first conductivity type comprises at least one of n-type and p-type. In some embodiments, a second conductivity type comprises n-type when the first conductivity type comprises p-type and comprises p-type when the first conductivity type comprises n-type. In some embodiments, the first conductive portion is connected to an electro static discharge (ESD) circuit. In some embodiments, a second conductive portion is on a second side of the first STI region. In some embodiments, the second conductive portion is formed within a second well. In some embodiments, the second well has the second conductivity type. In some embodiments, the second conductive portion has the first conductivity type. In some embodiments, the second conductive portion is connected to a first nanowire and at least one of an input output I/O port and a voltage supply. In some embodiments, the voltage supply comprises at least one of a VDD and a VSS. In some embodiments, the voltage supply comprises a voltage other than the VDD or the VSS. In some embodiments, the first nanowire is connected to the first conductive portion. In some embodiments, the first nanowire comprises a channel. In some embodiments, a gate surrounds the first nanowire. In some embodiments, the gate is connected to a voltage trigger source. In some embodiments, the voltage trigger source applies a voltage to the gate such that little to no current flows through the nanowire/channel.

According to some embodiments, the semiconductor device comprises the first conductive portion on the first side of the first STI region. In some embodiments, the first conductive portion is formed within the first well. In some embodiments, the first well has the first conductivity type. In some embodiments, the first conductive portion has the first conductivity type. In some embodiments, the first conductive portion is connected to an ESD circuit. In some embodiments, the second conductive portion is on the second side of the first STI region. In some embodiments, the second conductive portion is formed within the second well. In some embodiments, the second well has the second conductivity type. In some embodiments, the second conductive portion has the first conductivity type. In some embodiments, the second conductive portion is connected to the first nanowire and at least one of the I/O port and the voltage supply. In some embodiments, a fifth conductive portion is on a first side of a fourth STI region where the first conductive portion is on a second side of the fourth STI region. In some embodiments, the fifth conductive portion is formed within the first well. In some embodiments, the fifth conductive portion has the second conductivity type. In some embodiments, the fifth conductive portion is connected to the voltage supply. In some embodiments, the fifth conductive portion comprises at least some of the ESD circuit, where the ESD circuit comprises a silicon-controlled rectifier (SCR). In some embodiments, the first nanowire comprises a channel. In some embodiments, a gate surrounds the first nanowire. In some embodiments, the gate is connected to a voltage trigger source. In some embodiments, the voltage trigger source applies a voltage to the gate such that little to no current flows through the nanowire/channel.

According to some embodiments, the semiconductor device comprises the first conductive portion on the first side of the first STI region. In some embodiments, the first conductive portion is formed within the first well. In some embodiments, the first well has the first conductivity type. In some embodiments, the first conductive portion has the first conductivity type. In some embodiments, the first conductive portion is connected to an ESD circuit. In some embodiments, a first diode connected transistor is on the second side of the first STI region. In some embodiments, the first diode connected transistor comprises the second conductive portion formed within the second well. In some embodiments, the second well has the second conductivity type. In some embodiments, the second conductive portion has the first conductivity type. In some embodiments, the first diode connected transistor comprises the first nanowire connected to the second conductive portion, a first gate surrounding the first nanowire, and a first active area over the first nanowire. In some embodiments, the first active area is connected to the first gate. In some embodiments, the first active area has the first conductivity type and is connected to the first conductive portion. In some embodiments, the first gate of the first diode connected transistor regulates or governs the amount of current going through the first nanowire once the current reaches a current threshold. In some embodiments, when a current threshold is met, such as during an ESD event, the current bypasses the first diode connected transistor and travels through the second well and the first well to the ESD circuit.

According to some embodiments, such as when an ESD event occurs, a moderate amount of current travels through the first nanowire. In some embodiments, excess current from the ESD event travels from the second conductive portion through the second well and the first well to the ESD circuit bypassing the first nanowire. In some embodiments, by having excess current bypass the first nanowire a functional lifetime of the first nanowire is increased as compared to a device that does not have a mechanism that bypasses or shunts excess current away from a nanowire during an ESD event. In some embodiments, bypassing the first nanowire increases an ESD discharge capability as compared to a semiconductor device that does not have a mechanism that bypasses or shunts current away from the first nanowire and send excess current to the ESD circuit. In some embodiments, the ESD circuit is connected to ground to disperse the excess current.

FIGS. 1-8 are cross-sectional views of a semiconductor device 100, FIGS. 9-15 are cross-sectional views of a semiconductor device 200, and FIGS. 16-22 are cross-sectional views of a semiconductor device 300, according to some embodiments, at various stages of fabrication. Turning to FIG. 1, a first well 104a is over a substrate 102, according to some embodiments. In some embodiments, the substrate 102 includes at least one of an epitaxial layer, a silicon-on-insulator (SOI) structure, a wafer, and a die formed from a wafer. In some embodiments, the substrate 102 comprises at least one of silicon, carbon, etc. In some embodiments, the first well 104a has a first conductivity type. In some embodiments, the first conductivity type comprises at least one of p-type and n-type. In some embodiments, the first well 104a comprises at least one of silicon, carbon, etc. In some embodiments, the first well 104a comprises at least one of an n-type dopant and a p-type dopant.

According to some embodiments, a first conductive portion 108a is within the first well 104a on a first side 103a of a first shallow trench isolation (STI) region 106b. In some embodiments, the first conductive portion 108a has the first conductivity type. In some embodiments, a second conductive portion 108b is in a second well 104b on a second side 103b of the first STI region 106b. In some embodiments, the second well 104b has the second conductivity type. In some embodiments, the second conductivity type comprises n-type when the first conductivity type comprises p-type and comprises p-type when the first conductivity type comprises n-type. In some embodiments, the second conductive portion 108b has the first conductivity type. In some embodiments, a third conductive portion 108c is in the second well 104b on a second side 105b of a second STI region 106c, where the second conductive portion 108b is on a first side 105a of the second STI region 106c. In some embodiments, the third conductive portion 108c has the second conductivity type. In some embodiments, the first conductive portion 108a is on a second side 107b of a third STI region 106a. In some embodiments, at least one of the first conductive portion 108a, the second conductive portion 108b, and the third conductive portion 108c comprise at least one of silicon, carbon, etc. In some embodiments, at least one of the first conductive portion 108a, the second conductive portion 108b, and the third conductive portion 108c comprise at least one of an n-type dopant and a p-type dopant.

According to some embodiments, at least one of the first STI region 106b and the second STI region 106c extend into the second well 104b. In some embodiments, at least one of the first STI region 106b and the third STI region 106a extend into the first well 104a. In some embodiments, at least one of the first STI region 106b, the second STI region 106c, and the third STI region 106a comprise a high dielectric constant material. In some embodiments, at least one of the first STI region 106b, the second STI region 106c, and the third STI region 106a comprise at least one of nitride, oxide, etc.

Figure 2:
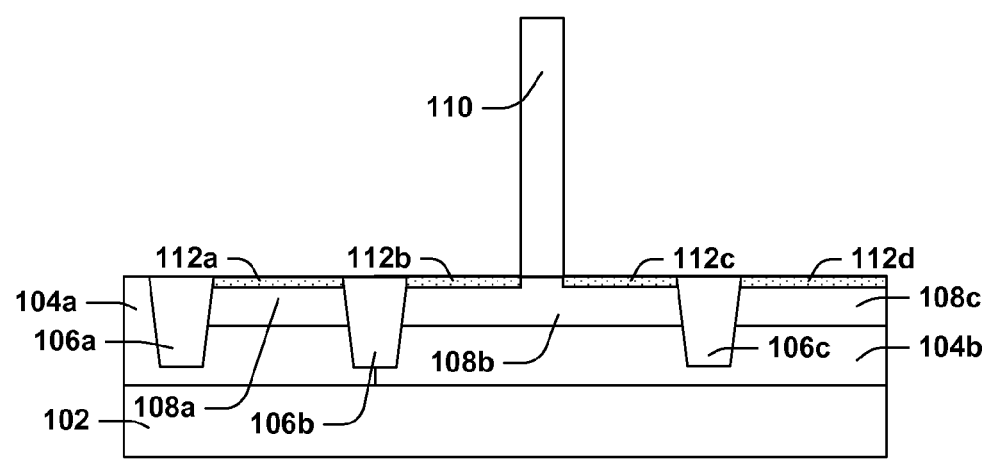
FIG. 2 is an illustration of a semiconductor device at a stage of fabrication, in accordance with some embodiments.

Turning to FIG. 2, a first nanowire 110 is formed over the second conductive portion 108b, according to some embodiments. In some embodiments, the first nanowire 110 comprises at least one of silicon, carbon, etc. In some embodiments, the first nanowire 110 is a small conductive wire or structure, such as having one or more dimensions on the order of nanometers. In some embodiments, the first nanowire 110 has a height to thickness ratio greater than about 800. In some embodiments, the thickness is measured left to right on the page. In some embodiments, the height is measured top to bottom on the page. In some embodiments, the first nanowire 110 has a first thickness, measured from left to right on the page, between about 5 nm to about 15 nm. In some embodiments, the first nanowire 110 has a first height, measured from top to bottom on the page from a top surface of the second conductive portion 108b to a top surface of the first nanowire 110, between about 50 nm to about 1500 nm. In some embodiments, the first nanowire 110 is grown. In some embodiments, a first silicide portion 112a is formed over the first conductive portion 108a, a second silicide portion 112b and a third silicide portion 112c are formed adjacent the first nanowire 110 and over the second conductive portion 108b, and a fourth silicide portion 112d is formed over the third conductive portion 108c. In some embodiments, the silicide portions 112a-112d are formed by forming a metal layer (not shown) over the third STI region 106a, the first conductive portion 108a, the first STI region 106b, the second conductive portion 108b, the second STI region 106c, and the third conductive portion 108c, according to some embodiments. In some embodiments, the metal layer comprises at least one of tungsten, titanium, tin, etc. In some embodiments, the first nanowire 110 is formed after the metal layer is formed. In some embodiments, such as when the first nanowire 110 is formed after the metal layer is formed, a portion of the metal layer is removed from over the second conductive portion 108b and the first nanowire 110 is formed on the exposed portion of the second conductive portion 108b. In some embodiments, the silicide portions 112a-112d are formed by annealing the metal layer at a first annealing temperature between about 500° C. to about 1000° C. for a first duration between about 1 sec to about 30 min. In some embodiments, the first nanowire 110 is at least one of formed before and formed after the annealing.

Figure 3:
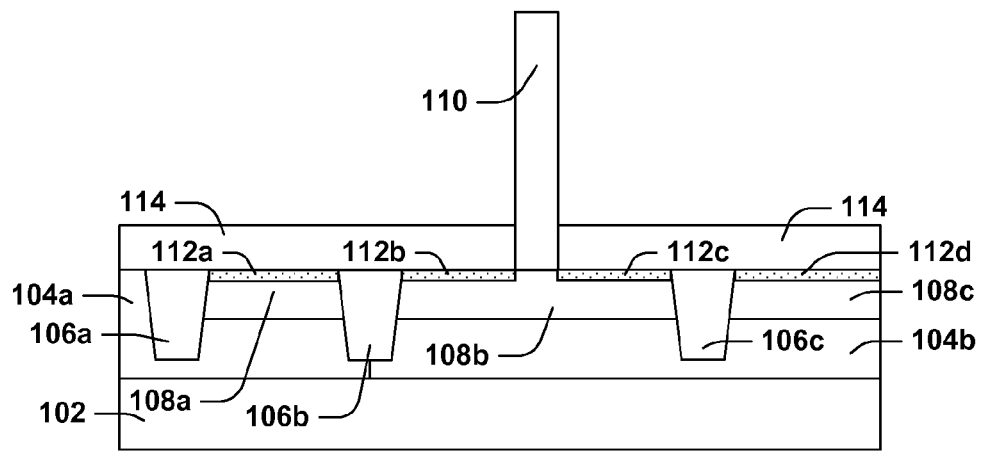
FIG. 3 is an illustration of a semiconductor device at a stage of fabrication, in accordance with some embodiments.

Turning to FIG. 3, a first dielectric layer 114 is formed over at least one of the first well 104a, the third STI region 106a, the first silicide portion 112a, the first STI region 106b, the second silicide portion 112b, the third silicide portion 112c, the second STI region 106c, and the fourth silicide portion 112d, according to some embodiments. In some embodiments, the first dielectric layer 114 is formed on sidewalls of the first nanowire 110. In some embodiments, the first dielectric layer 114 comprises a low dielectric constant material. In some embodiments, the first dielectric layer 114 comprises at least one of nitride, oxide, etc. In some embodiments, the first dielectric layer 114 is at least one of grown, deposited, etc. In some embodiments, the first dielectric layer 114 is formed by at least one of atomic layer deposition (ALD), chemical vapor deposition (CVD), physical vapor deposition (PVD), etc.

Figure 4:
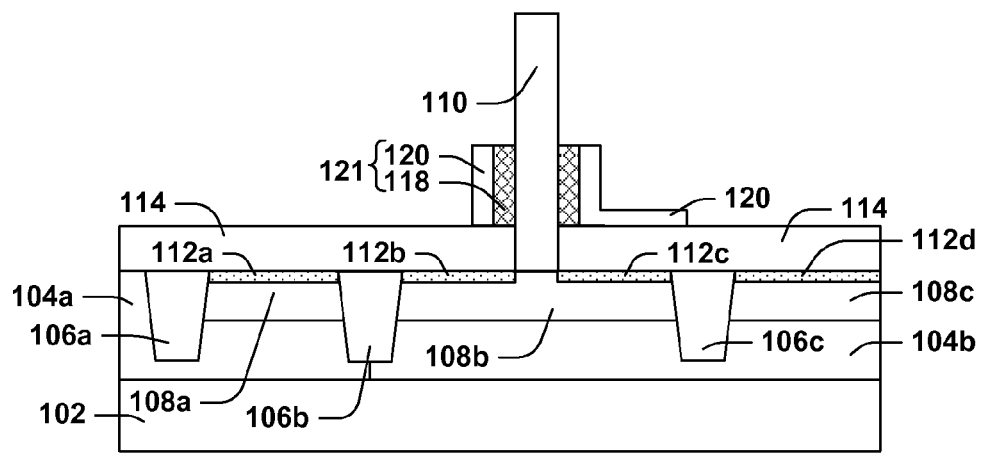
FIG. 4 is an illustration of a semiconductor device at a stage of fabrication, in accordance with some embodiments.

Turning to FIG. 4, a first gate 121 is formed around the first nanowire 110, according to some embodiments. In some embodiments, a layer of gate dielectric material (not shown) is formed over the first dielectric layer 114 and on sidewalls of the first nanowire 110. In some embodiments, the layer of gate dielectric material comprises a high dielectric constant material. In some embodiments, the layer of gate dielectric material comprises at least one of nitride, oxide, etc. In some embodiments, the layer of gate dielectric material is formed by at least one of growth, deposition, etc. In some embodiments, the layer of gate dielectric material is formed by at least one of ALD, PVD, CVD, etc. In some embodiments, the layer of gate dielectric material is patterned to form a first gate dielectric 118 around the first nanowire 110. In some embodiments, the layer of gate dielectric material is patterned by etching.

According to some embodiments, a layer of gate electrode material (not shown) is formed over the first dielectric material 114 and the first gate dielectric 118. In some embodiments, the layer of gate electrode material comprises at least one of metal, polysilicon, etc. In some embodiments, the layer of gate electrode material is formed by at least one of growth, deposition, etc. In some embodiments, the layer of gate electrode material is formed by at least one of ALD, PVD, CVD, etc. In some embodiments, the layer of gate electrode material is patterned to form a first gate electrode 120 around the first gate dielectric 118 to form the first gate 121. In some embodiments, the layer of gate electrode material is patterned by etching. In some embodiments, the first gate electrode 120 is formed by deposition.

Figure 5:
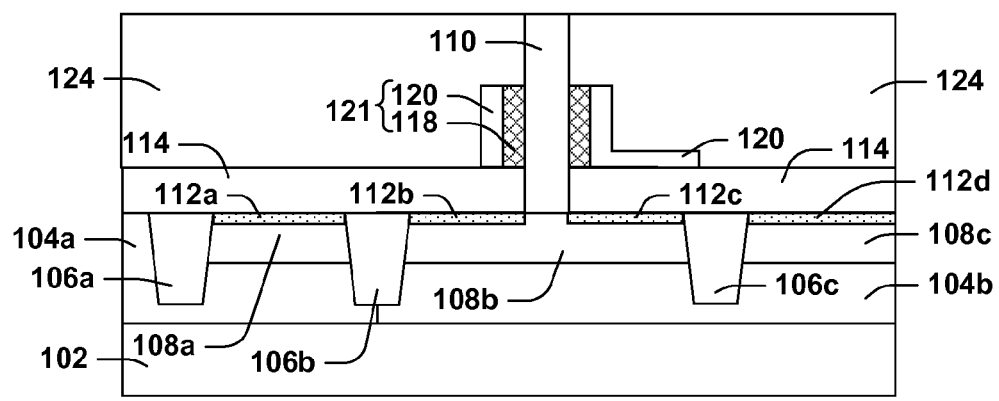
FIG. 5 is an illustration of a semiconductor device at a stage of fabrication, in accordance with some embodiments.

Turning to FIG. 5, a second dielectric layer 124 is formed over at least one of the first dielectric layer 114, the first gate 121, and the first nanowire 110, according to some embodiments. In some embodiments, the second dielectric layer 124 comprises a low dielectric constant material. In some embodiments, the second dielectric layer 124 comprises at least one of nitride, oxide, etc. In some embodiments, the second dielectric layer 124 is at least one of grown, deposited, etc. In some embodiments, the second dielectric layer 124 is formed by at least one of ALD, CVD, PVD, etc. In some embodiments, the second dielectric layer 124 comprises the same material as the first dielectric layer 114. In some embodiments, the second dielectric layer 124 is planerized by chemical mechanical planarization (CMP) such that a top surface of the first nanowire 110 is exposed.

Figure 6:
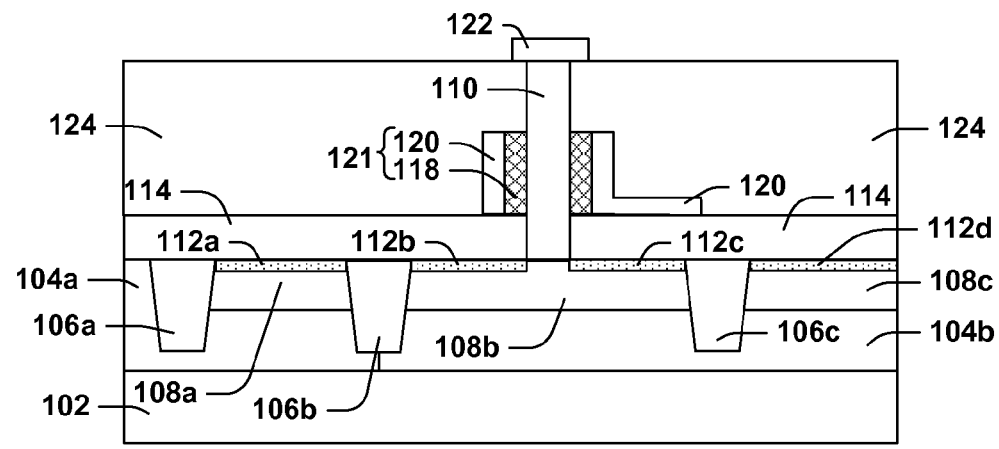
FIG. 6 is an illustration of a semiconductor device at a stage of fabrication, in accordance with some embodiments.

Turning to FIG. 6, a first active area 122 is formed over the top surface of the first nanowire 110, according to some embodiments. In some embodiments, a layer of active area material (not shown) is formed over the second dielectric layer 124 and the first nanowire 110. In some embodiments, the layer of active area material is at least one of grown, deposited, etc. In some embodiments, the layer of active area material is formed by at least one of ALD, CVD, PVD, etc. In some embodiments, the layer of active area material has the first conductivity type. In some embodiments, the layer of active area material is patterned to form the first active area 122. In some embodiments, the first active area 122 is formed by deposition.

According to some embodiments, the second conductive portion 108b, the first nanowire 110, the first gate 121, and the first active area 122 forms a first transistor. In some embodiments, the second conductive portion 108b comprises at least one of a source and a drain. In some embodiments, the first nanowire 110 comprises a channel. In some embodiments, the first active area 122 comprises a source if the second conductive portion 108b comprises a drain, and a drain if the second conductive portion 108b comprises a source Turning to FIG. 7, a third dielectric layer 126 is formed over the second dielectric layer 124 and the first active area 122, according to some embodiments. In some embodiments, the third dielectric layer 126 comprises a high dielectric constant material. In some embodiments, the third dielectric layer 126 comprises at least one of nitride, oxide, etc. In some embodiments, the third dielectric layer 126 comprises the same material as the second dielectric layer 124. In some embodiments, the third dielectric layer 126 is at least one of grown, deposited, etc. In some embodiments, the third dielectric layer 126 is formed by at least one of ALD, CVD, PVD, etc.

Figure 8:
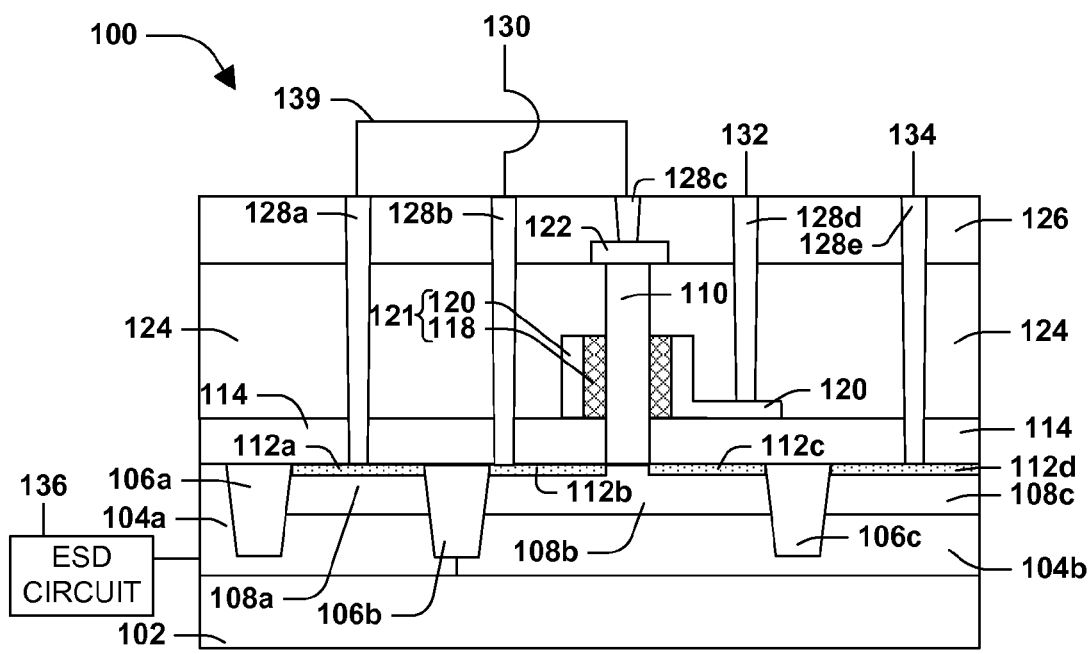
FIG. 8 is an illustration of a semiconductor device at a stage of fabrication, in accordance with some embodiments.

Turning to FIG. 8, a first portion contact 128a is formed over and connected through the first silicide portion 112a to the first conductive portion 108a, an input contact 128b is formed over and connected through the second silicide portion 112b to the second conductive portion 108b, a first transistor contact 128c is formed over and connected to the first active area 122, a gate contact 128d is formed over and connected to the first gate electrode 120, a third portion contact 128e is formed over and connected through the fourth silicide portion 112d to the third conductive portion 108c, according to some embodiments. In some embodiments, the first well 104a is connected to an electro static discharge (ESD) circuit 136. In some embodiments, the ESD circuit 136 is connected a voltage source substantially equal to 0V. In some embodiments, the ESD circuit 136 disperses the excess current.

To form the first portion contact 128a, a first opening is formed through the third dielectric layer 126, the second dielectric layer 124 and the first dielectric layer 114 to expose at least some of the first silicide portion 112a, according to some embodiments. In some embodiments, the first opening is formed by etching. In some embodiments, a conductive material is formed in the first opening to form the first portion contact 128a. In some embodiments, the conductive material comprises at least one of metal, metalloid, etc. To form the input contact 128b, a second opening is formed through the third dielectric layer 126, the second dielectric layer 124 and the first dielectric layer 114 to expose at least some of the second silicide portion 112b, according to some embodiments. In some embodiments, the second opening is formed by etching. In some embodiments, a conductive material is formed in the second opening to form the input contact 128b. In some embodiments, the conductive material comprises at least one of metal, metalloid, etc.

To form the first transistor contact 128c, a third opening is formed through the third dielectric layer 126 to expose at least some of the first active area 122, according to some embodiments. In some embodiments, the third opening is formed by etching. In some embodiments, a conductive material is formed in the third opening to form the first transistor contact 128c. In some embodiments, the conductive material comprises at least one of metal, metalloid, etc. To form the gate contact 128d, a fourth opening is formed through the third dielectric layer 126 and the second dielectric layer 124 to expose at least some of the first gate electrode 120, according to some embodiments. In some embodiments, the fourth opening is formed by etching. In some embodiments, a conductive material is formed in the fourth opening to form the gate contact 128d. In some embodiments, the conductive material comprises at least one of metal, metalloid, etc. To form the third portion contact 128e, a fifth opening is formed through the third dielectric layer 126, the second dielectric layer 124, and the first dielectric layer 114 to expose at least some of the fourth silicide portion 112d, according to some embodiments. In some embodiments, the fifth opening is formed by etching. In some embodiments, a conductive material is formed in the fifth opening to form the third portion contact 128e. In some embodiments, the conductive material comprises at least one of metal, metalloid, etc.

According to some embodiments, an active area connection 139 connects the first active area 122 to the first portion contact 128a. In some embodiments, the input contact 128b is connected to a first source 130. In some embodiments, the first source 130 comprises at least one of an input output (I/O) port and a voltage supply. In some embodiments, the voltage supply comprises at least one of a VDD and a VSS. In some embodiments, the gate contact 128c is connected to a voltage trigger source 132. In some embodiments, the voltage trigger source applies a voltage to the gate 121 such that a moderate amount of current flows through the first nanowire 110 when excess current is introduced into the input contact 129b. In some embodiments, the third portion contact 128e is connected to a second source 134, which comprises at least one of an input output (I/O) port and the voltage supply. In some embodiments, the first source 130 and the second source 134 comprise the same source. In some embodiments, the VDD comprises a voltage greater than 0V. In some embodiments, the VSS comprises a voltage about equal to 0V. In some embodiments, the I/O port comprises a connection to an outside voltage source.

According to some embodiments, such as when an ESD event occurs, excess current from the ESD event travels from the second conductive portion 108b through the second well 104b and the first well 104a to the ESD circuit 136. In some embodiments, excess current travels from the third conductive portion 108c through the second well 104b and the first well 104a to the ESD circuit 136. In some embodiments, excess current travels from the second conductive portion 108b through the second well 104b and the first well 104a to the ESD circuit 136. In some embodiments, excess current travels from the ESD circuit 136 through the first well 104a and the second well 104b to the second conductive portion 108b. In some embodiments, excess current bypasses the first nanowire 110. In some embodiments, by having excess current bypass the first nanowire 110 a functional lifetime of the first nanowire is increased as compared to a device that does not have a mechanism that bypasses or shunts excess current away from a nanowire during an ESD event. In some embodiments, having excess current bypass the first nanowire 110 increases an ESD discharge capability as compared to a semiconductor device that does not have a mechanism that bypasses or shunts excess current away from the first nanowire and sends excess current to the ESD circuit.

Figure 9:
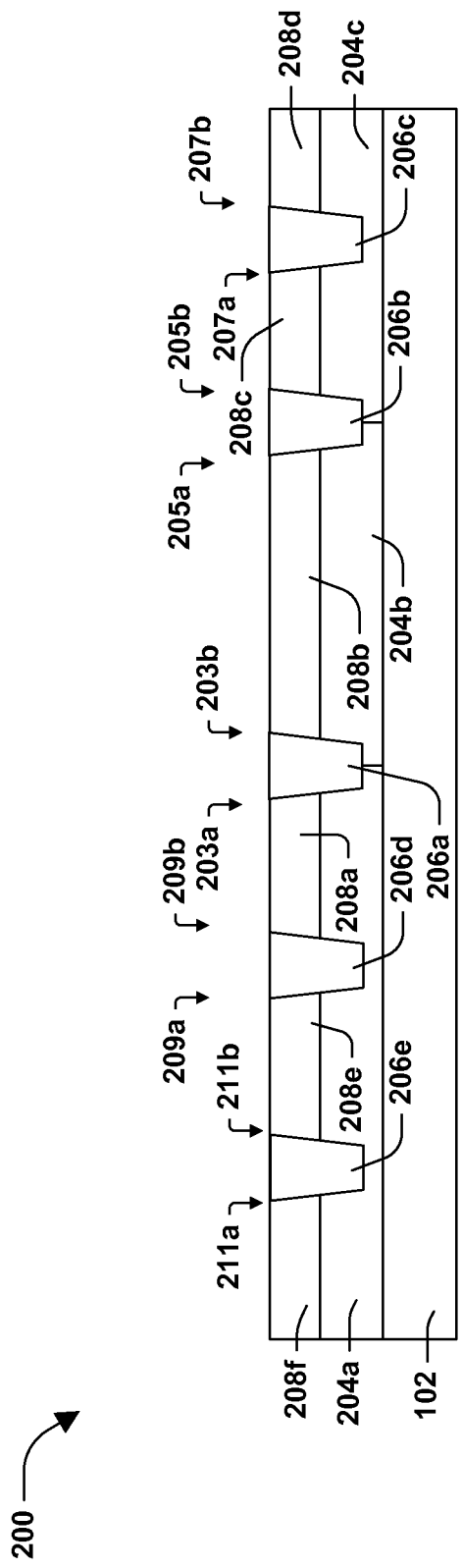
FIG. 9 is an illustration of a semiconductor device at a stage of fabrication, in accordance with some embodiments.

FIGS. 9-15 are cross-sectional views of a semiconductor device 200, according to some embodiments, at various stages of fabrication. Turning to FIG. 9, a first well 204a is over the substrate 102, according to some embodiments. In some embodiments, the first well 204a has the first conductivity type. In some embodiments, the first well 204a comprises at least one of silicon, carbon, etc. In some embodiments, the first well 204a comprises at least one of an n-type dopant and a p-type dopant.

According to some embodiments, a first conductive portion 208a is within the first well 204a on a first side 203a of a first STI region 206a. In some embodiments, the first conductive portion 208a has the first conductivity type. In some embodiments, a second conductive portion 208b is in a second well 204b on a second side 203b of the first STI region 206a. In some embodiments, the second well 204b has the second conductivity type. In some embodiments, the second conductive portion 208b has the first conductivity type. In some embodiments, a third conductive portion 208c is in a third well 204c on a second side 205b of a second STI region 206b, where the second conductive portion 208b is on a first side 205a of the second STI region 206b. In some embodiments, the third conductive portion 208c has the first conductivity type. In some embodiments, a fourth conductive portion 208d is on a second side 207b of a third STI region 206c, where the third conductive portion 208c is on a first side 207a of the third STI region 206c. In some embodiments, a fifth conductive portion 208e is in the first well 204a on a first side 209a of a fourth STI region 206d, where the first conductive portion 208a is on a second side 209b of the fourth STI region 206d. In some embodiments, the fifth conductive portion 208e has the second conductivity type. In some embodiments, a sixth conductive portion 208f is in the first well 204a on a first side 211a of a fifth STI region 206e, where the fifth conductive portion 208e is on a second side 211b of the fifth STI region 206e. In some embodiments, the sixth conductive portion 208f has the first conductivity type.

According to some embodiments, at least one of the first conductive portion 208a, the second conductive portion 208b, the third conductive portion 208c, the fourth conductive portion 208d, the fifth conductive portion 208e, and the sixth conductive portion 208f comprise at least one of silicon, carbon, etc. In some embodiments, at least one of the first conductive portion 208a, the second conductive portion 208b, the third conductive portion 208c, the fourth conductive portion 208d, the fifth conductive portion 208e, and the sixth conductive portion 208f comprise at least one of an n-type dopant and a p-type dopant.

According to some embodiments, at least one of the first STI region 206a, the fourth STI region 206d, and the fifth STI region 206e extend into the first well 204a. In some embodiments, at least one of the first STI region 206a and the second STI region 206b extend into the second well 204b. In some embodiments, at least one of the second STI region 206b and the third STI region 206c extend into the third well 204c. In some embodiments, at least one of the first STI region 206a, the second STI region 206b, the third STI region 206c, the fourth STI region 206d, and the fifth STI region 206e comprise a high dielectric constant material. In some embodiments, at least one of the first STI region 206a, the second STI region 206b, the third STI region 206c, the fourth STI region 206d, and the fifth STI region 206e comprise at least one of nitride, oxide, etc.

Figure 10:
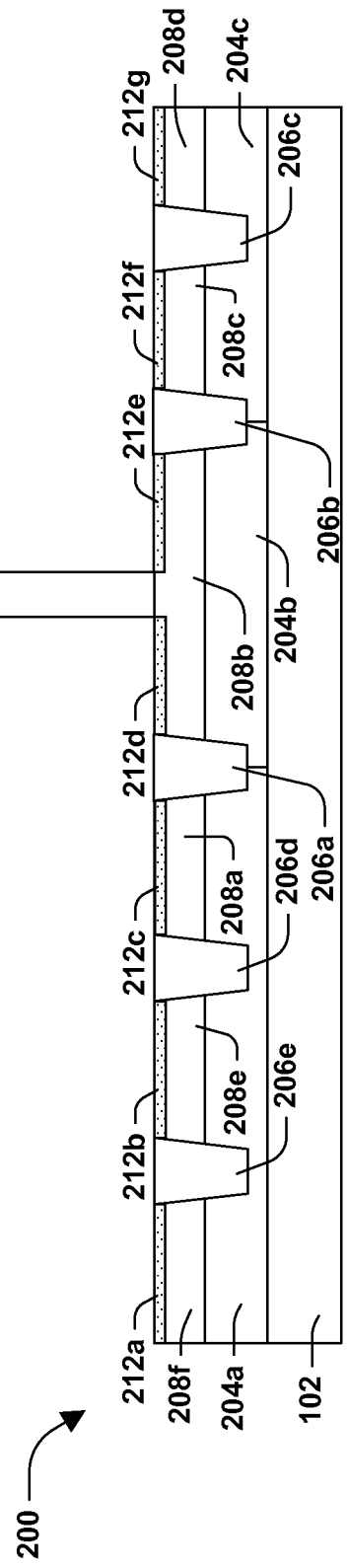
FIG. 10 is an illustration of a semiconductor device at a stage of fabrication, in accordance with some embodiments.

Turning to FIG. 10, a first nanowire 210 is formed over the second conductive portion 208b, according to some embodiments. In some embodiments, the first nanowire 210 comprises at least one of silicon, carbon, etc. In some embodiments, the first nanowire 210 is a small conductive wire or structure, such as having one or more dimensions on the order of nanometers. In some embodiments, the first nanowire 210 has a height to thickness ratio greater than about 800. In some embodiments, the thickness is measured left to right on the page. In some embodiments, the height is measured top to bottom on the page. In some embodiments, the first nanowire 210 has a first thickness, measured from left to right on the page, between about 5 nm to about 15 nm. In some embodiments, the first nanowire 210 has a first height, measured from top to bottom on the page from a top surface of the second conductive portion 208b to a top surface of the first nanowire 210, between about 50 nm to about 1500 nm. In some embodiments, the first nanowire 210 is grown.

According to some embodiments, a first silicide portion 212a is formed over the sixth conductive portion 208f, a second silicide portion 212b is formed over the fifth conductive portion 208e, a third silicide portion 212c is formed over the first conductive portion 208a, a fourth silicide portion 212d and a fifth silicide portion 212e are formed adjacent the first nanowire 210 and over the second conductive portion 208b, a sixth silicide portion 212f is formed over the third conductive portion 208c, and a seventh silicide portion 212g is formed over the fourth conductive portion 208d. In some embodiments, the silicide portions 212a-212g are formed by forming a metal layer (not shown) over the sixth conductive portion 208f, the fifth STI region 206e, the fifth conductive portion 208e, the fourth STI region 206d, the first conductive portion 208a, the first STI region 206a, the second conductive portion 208b, the second STI region 206b, the third conductive portion 208c, the third STI region 206c, and the fourth conductive portion 208d. In some embodiments, the metal layer comprises at least one of tungsten, titanium, tin, etc. In some embodiments, the first nanowire 210 is formed after the metal layer is formed. In some embodiments, such as when the first nanowire 210 is formed after the metal layer is formed, a portion the metal layer is removed from over the second conductive portion 208b and the first nanowire 210 is formed on the exposed portion of the second conductive portion 208b. In some embodiments, the silicide portions 112a-112g are formed by annealing the metal layer at the first annealing temperature for the first duration. In some embodiments, the first nanowire 210 is at least one of formed before and formed after the annealing.

Turning to FIG. 11, a first dielectric layer 214 is formed over at least one of the first silicide portion 212a, the fifth STI region 206e, the second silicide portion 212b, the fourth STI region 206d, the third silicide portion 212c, the first STI region 206a, the fourth silicide portion 212d, the fifth silicide portion 212e, the second STI region 206b, the sixth silicide portion 212f, the third STI region 206c, and the seventh silicide portion 212g, according to some embodiments. In some embodiments, the first dielectric layer 214 is formed in the same manner as described above with regards to the first dielectric layer 114, as illustrated in FIG. 3.

Turning to FIG. 12, a first gate 221 is formed around the first nanowire 210, according to some embodiments. In some embodiments, the first gate 221 comprising a first gate dielectric 218 and a first gate electrode 220 is formed around the first nanowire 210 in the same manner described above with regard to the first gate 121 and the first nanowire 110, as illustrated in FIG. 4.

Figure 13:
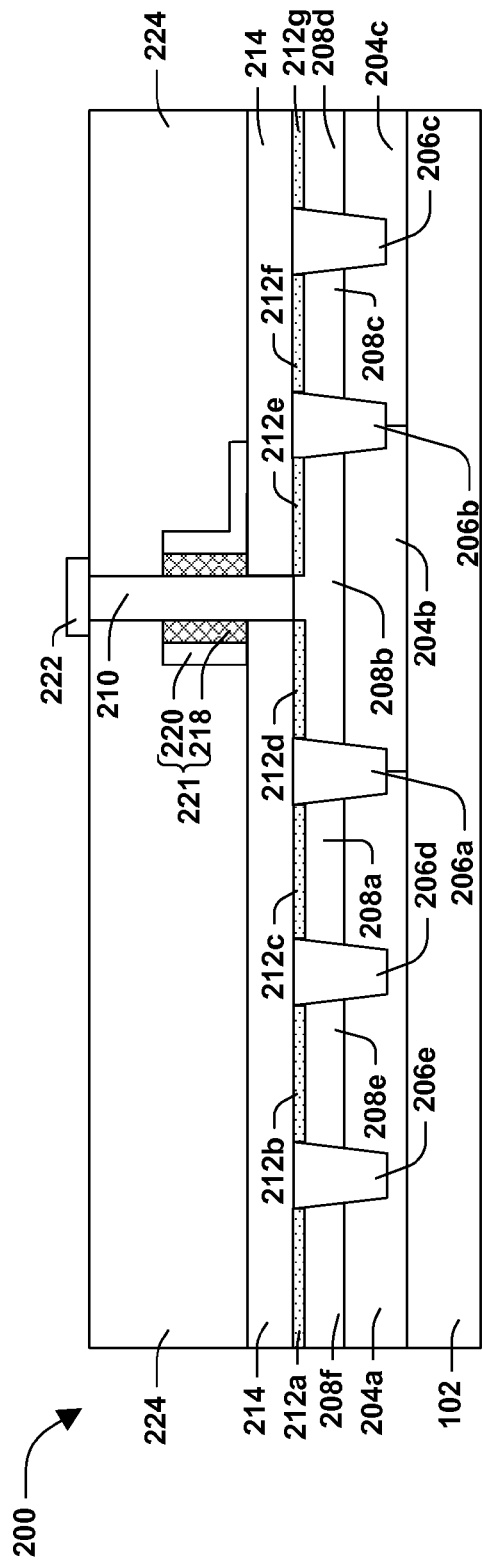
FIG. 13 is an illustration of a semiconductor device at a stage of fabrication, in accordance with some embodiments.

Turning to FIG. 13, a second dielectric layer 224 is formed over the first dielectric layer 214 and the first nanowire 210, according to some embodiments. In some embodiments, the second dielectric layer 224 is formed in the same manner described above with regard to the second dielectric layer 124, as illustrated in FIG. 5. In some embodiments, the second dielectric layer 224 is planerized by CMP such that a top surface of the first nanowire 210 is exposed. In some embodiments, a first active area 222 is formed over the top surface of the first nanowire 210, according to some embodiments. In some embodiments, the first active area 222 is formed in the same manner described above with regard to the first active area 122, as illustrated in FIG. 6.

Figure 7:
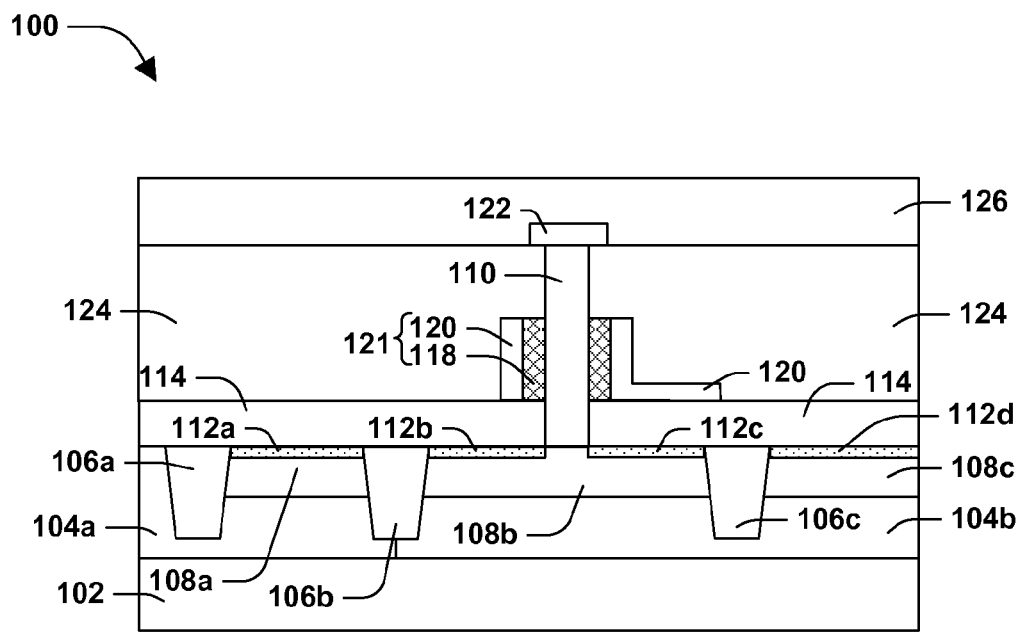
FIG. 7 is an illustration of a semiconductor device at a stage of fabrication, in accordance with some embodiments.
Figure 14:
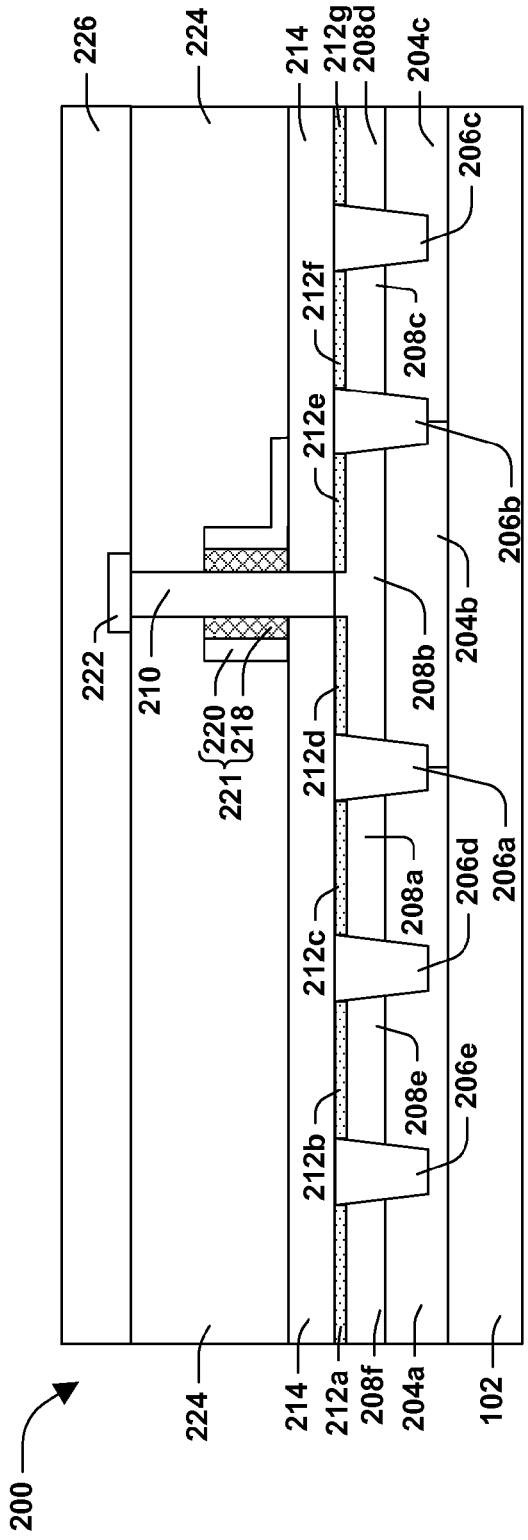
FIG. 14 is an illustration of a semiconductor device at a stage of fabrication, in accordance with some embodiments.

Turning to FIG. 14, a third dielectric layer 226 is formed over the second dielectric layer 224 and the first active area 222, according to some embodiments. In some embodiments, the third dielectric layer 226 is formed in the same manner described above with regard to the third dielectric layer 126, as illustrated in FIG. 7.

Figure 15:
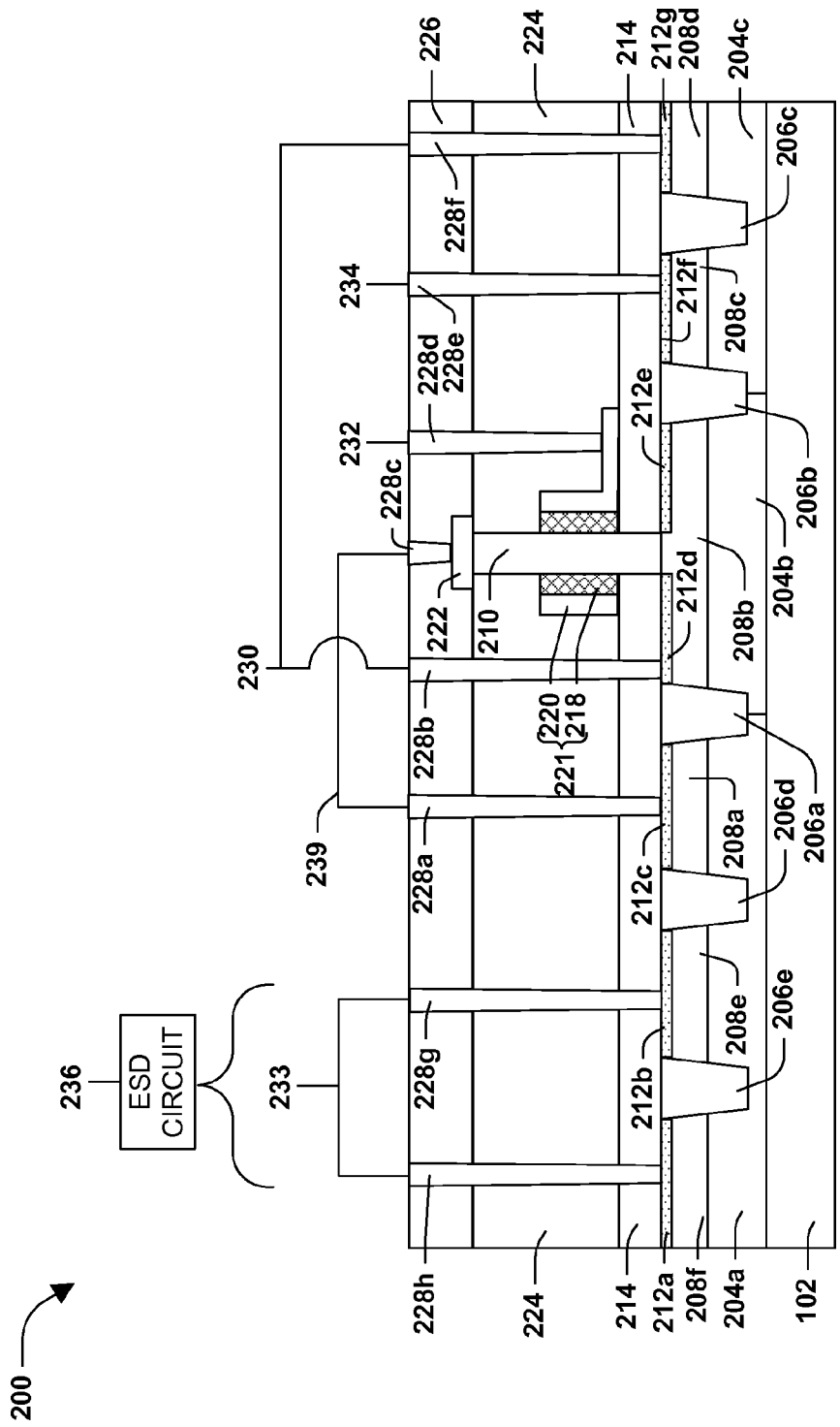
FIG. 15 is an illustration of a semiconductor device at a stage of fabrication, in accordance with some embodiments.

Turning to FIG. 15, a first portion contact 228*a* is formed over and connected through the third silicide portion 212*c* to the first conductive portion 208*a*, an input contact 228*b* is formed over and connected through the fourth silicide portion 212*d* to the second conductive portion 208*b*, a first transistor contact 228*c* is formed over and connected to the first active area 222, a gate contact 228*d* is formed over and connected to the first gate electrode 220, a third portion contact 228*e* is formed over and connected through the sixth silicide portion 212*f* to the third conductive portion 208*c*, according to some embodiments. In some embodiments, a fourth portion contact 228*f* is formed over and connected through the seventh silicide portion 212*g* to the fourth conductive portion 208*d*. In some embodiments, a fifth portion contact 228*g* is formed over and connected through the second silicide portion 212*b* to the fifth conductive portion 208*e*, and a sixth portion contact 228*h* is formed over and connected through the first silicide portion 212*a* to the sixth conductive portion 208*f* to form at least part of a silicon controlled rectifier (SCR). In some embodiments, the SCR comprises at least some of an ESD circuit 236. In some embodiments, the ESD circuit 236 is connected to a voltage source 233 substantially equal to 0V. In some embodiments, the ESD circuit 236 disperses the excess current.

To from the first portion contact 228*a*, a first opening is formed through the third dielectric layer 226, the second dielectric layer 224 and the first dielectric layer 214 to expose at least some of the third silicide portion 212*c*, according to some embodiments. In some embodiments, the first opening is formed by etching. In some embodiments, a conductive material is formed in the first opening to form the first portion contact 228*a*. In some embodiments, the conductive material comprises at least one of metal, metalloid, etc. To form the input portion contact 228*b*, a second opening is formed through the third dielectric layer 226, the second dielectric layer 224 and the first dielectric layer 214 to expose at least some of the fourth silicide portion 212*d*, according to some embodiments. In some embodiments, the second opening is formed by etching. In some embodiments, a conductive material is formed in the second opening to form the input portion contact 228*b*. In some embodiments, the conductive material comprises at least one of metal, metalloid, etc.

To form the transistor contact 228*c*, a third opening is formed through the third dielectric layer 226 to expose at least some of the first active area 222, according to some embodiments. In some embodiments, the third opening is formed by etching. In some embodiments, a conductive material is formed in the third opening to form the transistor contact 228*c*. In some embodiments, the conductive material comprises at least one of metal, metalloid, etc. To form the gate contact 228*d*, a fourth opening is formed through the third dielectric layer 226 and the second dielectric layer 224 to expose at least some of the first gate electrode 220, according to some embodiments. In some embodiments, the fourth opening is formed by etching. In some embodiments, a conductive material is formed in the fourth opening to form the gate contact 228*d*. In some embodiments, the conductive material comprises at least one of metal, metalloid, etc. To form the third portion contact 228*e*, a fifth opening is formed through the third dielectric layer 226, the second dielectric layer 224, and the first dielectric layer 214 to expose at least some of the sixth silicide portion 212*f*, according to some embodiments. In some embodiments, the fifth opening is formed by etching. In some embodiments, a conductive material is formed in the fifth opening to form the third portion contact 228*e*. In some embodiments, the conductive material comprises at least one of metal, metalloid, etc. To form the fourth portion contact 228*f*, a sixth opening is formed through the third dielectric layer 226, the second dielectric layer 224, and the first dielectric layer 214 to expose at least some of the seventh silicide portion 212*g*, according to some embodiments. In some embodiments, the sixth opening is formed by etching. In some embodiments, a conductive material is formed in the sixth opening to form the fourth portion contact 228*f*. In some embodiments, the conductive material comprises at least one of metal, metalloid, etc. To form the fifth portion contact 228*g*, a seventh opening is formed through the third dielectric layer 226, the second dielectric layer 224, and the first dielectric layer 214 to expose at least some of the second silicide portion 212*b*, according to some embodiments. In some embodiments, the seventh opening is formed by etching. In some embodiments, a conductive material is formed in the seventh opening to form the fifth portion contact 228*g*. In some embodiments, the conductive material comprises at least one of metal, metalloid, etc. To form the sixth portion contact 228*h*, an eighth opening is formed through the third dielectric layer 226, the second dielectric layer 224, and the first dielectric layer 214 to expose at least some of the first silicide portion 212*a*, according to some embodiments. In some embodiments, the eighth opening is formed by etching. In some embodiments, a conductive material is formed in the eighth opening to form the sixth portion contact 228*h*. In some embodiments, the conductive material comprises at least one of metal, metalloid, etc.

According to some embodiments, an active area connection 239 connects the first active area 222 through the transistor contact 228*c* to the first portion contact 228*a*. In some embodiments, the input contact 228*b* is connected to a first source 230. In some embodiments, the first source 230 comprises at least one of an I/O port and a voltage supply. In some embodiments, the voltage supply comprises at least one of a VDD and a VSS. In some embodiments, the gate contact 228*d* is connected to a voltage trigger source 232. In some embodiments, the voltage trigger source applies a voltage to the gate 221 such that a moderate amount of current flows through the first nanowire 210, when excess current is introduced into at least one of the input contact 228*b* and the fourth portion contact 228*f*. In some embodiments, the third portion contact 228*e* is connected to a second source 234. In some embodiments, the second source 234 comprises the I/O port when the first source 230 comprises at least one of the VDD and the VSS. In some embodiments, the second source 234 comprises the VDD when the first source 230 comprises at least one of the I/O port and the VSS. In some embodiments, the second source 234 comprises the VSS when the first source 230 comprises at least one of the I/O port and the VDD. In some embodiments, the fourth portion contact 228*f* is connected to the first source 230.

According to some embodiments, such as when an ESD event occurs, excess current from the ESD event travels from at least one of the second conductive portion 208*b* through the second well 204*b* and the first well 204*a* to the fifth conductive portion 208*e* bypassing the first nanowire 210, and the fifth conductive portion 208*e* through the first well 204*a* and the second well 204*b* to the second conductive portion 208*b* bypassing the first nanowire 210. In some embodiments, such as when an ESD event occurs, excess current from the ESD event travels from the fourth conductive portion 208*d* through the third well 204*c* and the second well 204*b* through the first well 204*a* to the fifth conductive portion 208*e*. In some embodiments, such as when an ESD event occurs, excess current from the ESD event travels from the fifth conductive portion 208e through the first well 204a, the second well 204b, and the third well 204c to the fourth conductive portion 208d. In some embodiments, such as when an ESD event occurs, and excess current bypasses the first nanowire 210, a moderate amount of current travels through the first nanowire 210. In some embodiments, by having excess current bypass the first nanowire 210 a functional lifetime of the first nanowire 210 is increased as compared to a device that does not have a mechanism that bypasses or shunts excess current away from a nanowire during an ESD event. In some embodiments, having excess current bypass the first nanowire 210 an ESD discharge capability is increased as compared to a semiconductor device that does not have a mechanism that bypasses or shunts excess current away from a first nanowire and send excess current to the ESD circuit.

FIGS. 16-22 are cross-sectional views of a semiconductor device 300, according to some embodiments, at various stages of fabrication. Turning to FIG. 16, a first well 304a is over the substrate 102, according to some embodiments. In some embodiments, the first well 304a has the first conductivity type. In some embodiments, the first well 304a comprises at least one of silicon, carbon, etc. In some embodiments, the first well 304a comprises at least one of an n-type dopant and a p-type dopant. In some embodiments, a first conductive portion 308a is within the first well 304a on a first side 303a of a first STI region 306a. In some embodiments, the first conductive portion 308a has the first conductivity type. In some embodiments, a second conductive portion 308b is in a second well 304b on a second side 303b of the first STI region 306a. In some embodiments, the second well 304b has the second conductivity type. In some embodiments, the second well 304b comprises at least one of silicon, carbon, etc. In some embodiments, the second well 304b comprises at least one of an n-type dopant and a p-type dopant. In some embodiments, the second conductive portion 308b has the first conductivity type. In some embodiments, a third conductive portion 308c is in the second well 304b on a second side 305b of a second STI region 306b, where the second conductive portion 308b is on a first side 305a of the second STI region 306b. In some embodiments, the third conductive portion 308c has the first conductivity type. In some embodiments, a fourth conductive portion 308d is in the second well 304b on a second side 307b of a third STI region 306c, where the third conductive portion 308c is on a first side 307a of the third STI region 306c. In some embodiments, the fourth conductive portion 308d is on a first side 309a of a fourth STI region 306d. In some embodiments, the first conductive portion 308a is on a second side 311b of a fifth STI region 306e. In some embodiments, at least one of the first conductive portion 308a, the second conductive portion 308b, the third conductive portion 308c, and the fourth conductive portion 308d comprises at least one of silicon, carbon, etc. In some embodiments, at least one of the first conductive portion 308a, the second conductive portion 308b, the third conductive portion 308c, and the fourth conductive portion 308d comprises at least one of an n-type dopant and a p-type dopant.

According to some embodiments, at least one of the fifth STI region 306e and the first STI region 306a extend into the first well 304a. In some embodiments, at least one of the first STI region 306a, the second STI region 306b, the third STI region 306c, and the fourth STI region 306d extend into the second well 304b. In some embodiments, at least one of the first STI region 306a, the second STI region 306b, the third STI region 306c, the fourth STI region 306d, and the fifth STI region 306e comprise a high dielectric constant material. In some embodiments, at least one of the first STI region 306a, the second STI region 306b, the third STI region 306c, the fourth STI region 306d, and the fifth STI region 306e comprise at least one of nitride, oxide, etc.

Turning to FIG. 17, a first nanowire 310a is formed over the second conductive portion 308b, a second nanowire 310b is formed over the third conductive portion 308c, a third nanowire 310c is formed over the fourth conductive portion 308d, according to some embodiments. In some embodiments, at least one of the first nanowire 310a, the second nanowire 310b, and the third nanowire 310c comprise at least one of silicon, carbon, etc. In some embodiments, at least one of the first nanowire 310a, the second nanowire 310b, and the third nanowire 310c comprise a small conductive wire or structure having one or more dimensions on the order of nanometers. In some embodiments, at least one of the first nanowire 310a, the second nanowire 310b, and the third nanowire 310c have a height to thickness ratio greater than about 800. In some embodiments, the thickness is measured left to right on the page. In some embodiments, the height is measured top to bottom on the page. In some embodiments, at least one of the first nanowire 310a, the second nanowire 310b, and the third nanowire 310c have a first thickness, measured from left to right on the page, between about 5 nm to about 15 nm. In some embodiments, at least one of the first nanowire 310a, the second nanowire 310b, and the third nanowire 310c have a first height, measured from top to bottom on the page, between about 50 nm to about 1500 nm. In some embodiments, at least one of the first nanowire 310a, the second nanowire 310b, and the third nanowire 310c are grown.

According to some embodiments, a first silicide portion 312a is formed over the first conductive portion 308a, a second silicide portion 312b and a third silicide portion 312c are formed adjacent the first nanowire 310a over the second conductive portion 308b, a fourth silicide portion 312d and a fifth silicide portion 312e are formed adjacent the second nanowire 310b over the third conductive portion 308c, and a sixth silicide portion 312f and a seventh silicide portion 312g are formed adjacent the third nanowire 310c over the fourth conductive portion 308d. In some embodiments, the silicide portions 112a-112g are formed by forming a metal layer (not shown) over the fifth STI region 306e, the first conductive portion 308a, the first STI region 306a, the second conductive portion 308b, the second STI region 306b, the third conductive portion 308c, the third STI region 306c, the fourth conductive portion 308d, and the fourth STI region 306d. In some embodiments, the metal layer comprises at least one of tungsten, titanium, tin, etc. In some embodiments, at least one of the first nanowire 310a, the second nanowire 310b, and the third nanowire 310c are formed after the metal layer is formed. In some embodiments, such as when at least one of the first nanowire 310a, the second nanowire 310b, and the third nanowire 310c are formed after the metal layer is formed, portions the metal layer are removed from over the second conductive portion 308b, the third conductive portion 308c, and the fourth conductive portion 308d. In some embodiments, such as when the first nanowire 310a is formed after the metal layer is formed, the first nanowire 310a is formed on an exposed portion of the second conductive portion 308b. In some embodiments, such as when the second nanowire 310b is formed after the metal layer is formed, the second nanowire 310b is formed on an exposed portion of the third conductive portion 308c. In some embodiments, such as when the third nanowire 310c is formed after the metal layer is formed, the third nanowire 310c is formed on an exposed portion of the fourth conductive portion 308d. In some embodiments, the silicide portions 112a-112g are formed by annealing the metal layer at the first annealing temperature for the first duration. In some embodiments, at least one of the first nanowire 310a, the second nanowire 310b, and the third nanowire 310c are at least one of formed before and formed after the annealing.

Turning to FIG. 18, a first dielectric layer 314 is formed over at least one of the fifth STI region 306e, the first silicide portion 312a, the first STI region 306a, the second silicide portion 312b, the third silicide portion 312c, the second STI region 306b, the fourth silicide portion 312d, the fifth silicide portion 312e, the third STI region 306c, the sixth silicide portion 312f, the seventh silicide portion 212g, and the fourth STI region 306d, according to some embodiments. In some embodiments, the first dielectric layer 314 is formed in the same manner as described above with regards to the first dielectric layer 114, as illustrated in FIG. 3.

Turning to FIG. 19, at least one of a first gate 321a comprising a first gate dielectric 318a and a first gate electrode 320a is formed around the first nanowire 310a, a second gate 221b comprising a second gate dielectric 318b and a second gate electrode 320b is formed around the second nanowire 310b, and a third gate 221c comprising a third gate dielectric 318c and a third gate electrode 320c is formed around the third nanowire 310c, according to some embodiments. In some embodiments, at least one of the first gate 321a formed around the first nanowire 310a, the second gate 321b formed around the second nanowire 310b, and the third gate 321c formed around the third nanowire 310c are formed in the same manner described above with regard to the first gate 121 formed around the first nanowire 110, as illustrated in FIG. 4.

Figure 20:
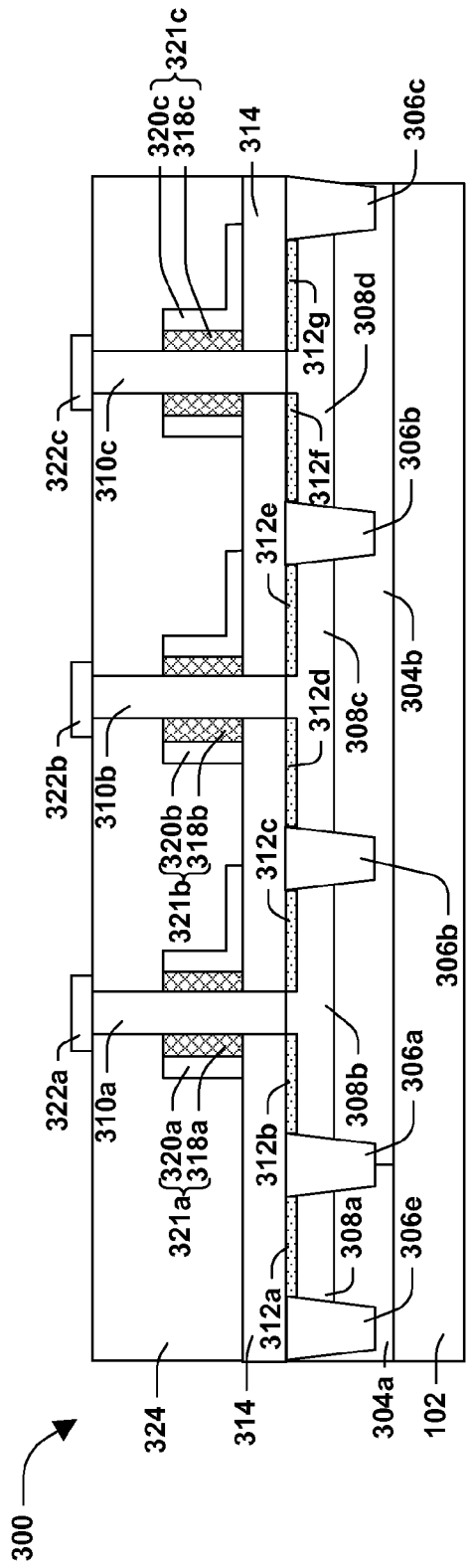
FIG. 20 is an illustration of a semiconductor device at a stage of fabrication, in accordance with some embodiments.

Turning to FIG. 20, a second dielectric layer 324 is formed over the first dielectric layer 314, the first nanowire 310a, the second nanowire 310b, and the third nanowire 310c, according to some embodiments. In some embodiments, the second dielectric layer 324 is formed in the same manner described above with regard to the second dielectric layer 124, as illustrated in FIG. 5. In some embodiments, the second dielectric layer 324 is planerized by CMP such that a top surface of at least one of the first nanowire 310a, the second nanowire 310b, and the third nanowire 310c are exposed. In some embodiments, a first active area 322a is formed over the top surface of the first nanowire 310a, a second active area 322b is formed over the top surface of the second nanowire 310b, and a third active area 322c is formed over the top surface of the third nanowire 310c, according to some embodiments. In some embodiments, at least one of the first active area 322a, the second active area 322b, and the third active area 322c are formed in the same manner described above with regard to the first active area 112, as illustrated in FIG. 6.

Figure 21:
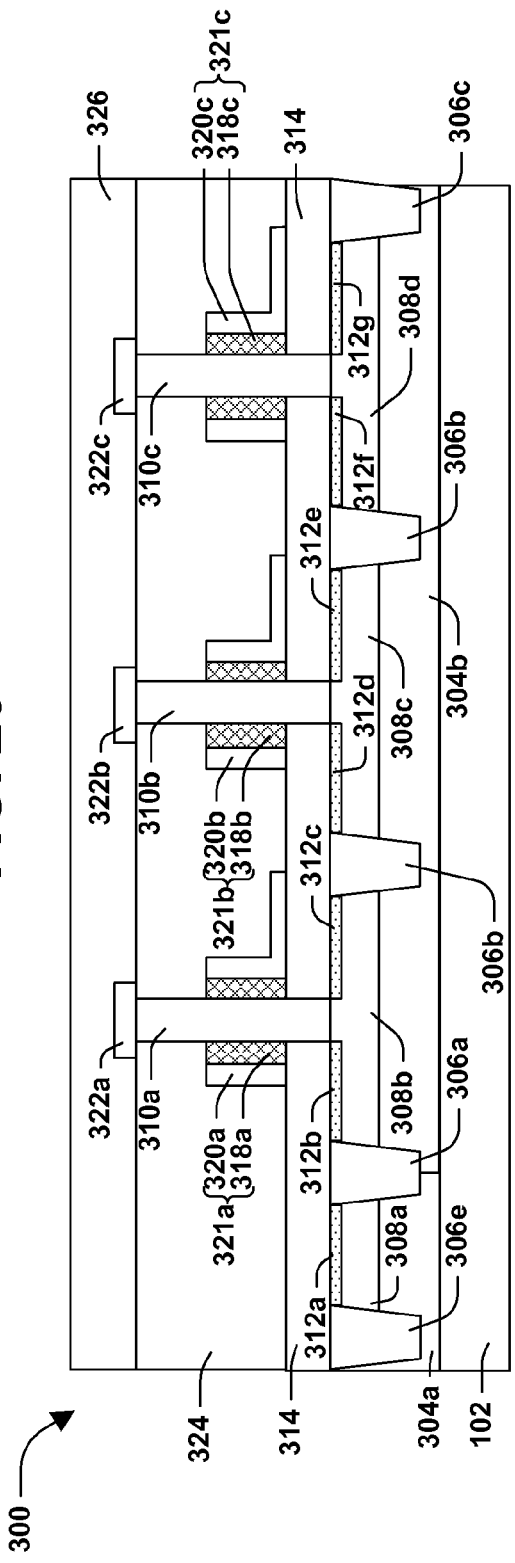
FIG. 21 is an illustration of a semiconductor device at a stage of fabrication, in accordance with some embodiments.

Turning to FIG. 21, a third dielectric layer 326 is formed over the second dielectric layer 324, the first active area 322a, the second active area 322b, and the third active area 322c, according to some embodiments. In some embodiments, the third dielectric layer 326 is formed in the same manner described above with regard to the third dielectric layer 126, as illustrated in FIG. 7.

Figure 22:
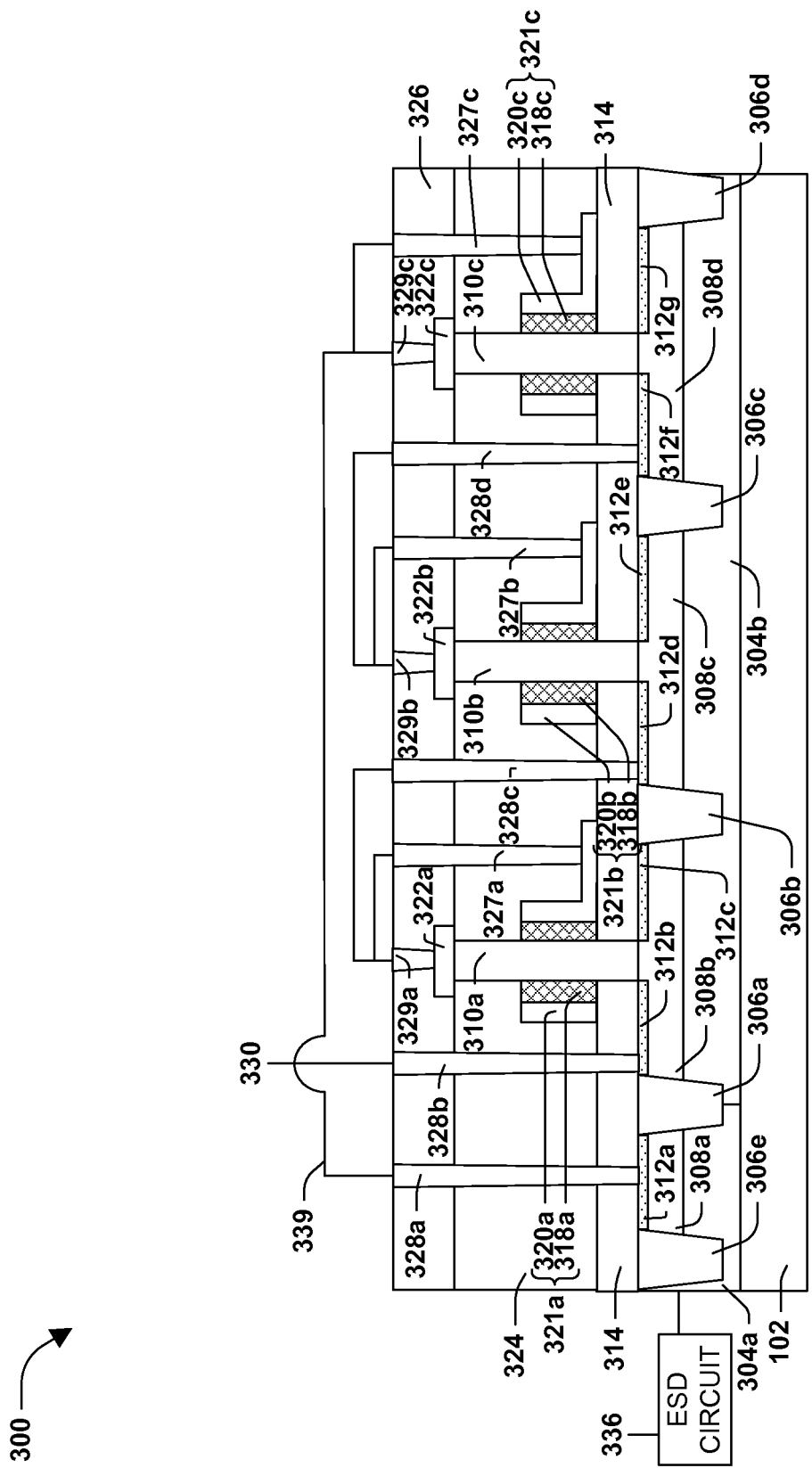
FIG. 22 is an illustration of a semiconductor device at a stage of fabrication, in accordance with some embodiments.

Turning to FIG. 22, a first portion contact 328a is formed over and connected through the first silicide portion 312a to the first conductive portion 308a, an input contact 328b is formed over and connected through the second silicide portion 312b to the second conductive portion 308b, a first transistor contact 329a is formed over and connected to the first active area 322a, a first gate contact 327a is formed over and connected to the first gate electrode 320a, a third portion contact 328c is formed over and connected through the fourth silicide portion 312d to the third conductive portion 308c, according to some embodiments. In some embodiments, a second transistor contact 329b is formed over and connected to the second active area 322b, a second gate contact 327b is formed over and connected to the second gate electrode 320b, a fourth portion contact 328d is formed over and connected through the sixth silicide portion 312f to the fourth conductive portion 308d. In some embodiments, a third transistor contact 329c is formed over and connected to the third active area 322c, a third gate contact 327c is formed over and connected to the third gate electrode 320c.

According to some embodiments, the first well 304a is connected to an ESD circuit 336. In some embodiments, the ESD circuit 336 is connected a voltage source substantially equal to 0V. In some embodiments, the ESD circuit 336 disperses the excess current.

To form the first portion contact 328a, a first opening is formed through the third dielectric layer 326, the second dielectric layer 324 and the first dielectric layer 314 to expose at least some of the first silicide portion 312a, according to some embodiments. In some embodiments, the first opening is formed by etching. In some embodiments, a conductive material is formed in the first opening to form the first portion contact 328a. In some embodiments, the conductive material comprises at least one of metal, metalloid, etc. To form the input portion contact 328b, a second opening is formed through the third dielectric layer 326, the second dielectric layer 324 and the first dielectric layer 314 to expose at least some of the second silicide portion 312b, according to some embodiments. In some embodiments, the second opening is formed by etching. In some embodiments, a conductive material is formed in the second opening to form the input portion contact 328b. In some embodiments, the conductive material comprises at least one of metal, metalloid, etc.

To form the first transistor contact 329a, a third opening is formed through the third dielectric layer 326 to expose at least some of the first active area 322a, according to some embodiments. In some embodiments, the third opening is formed by etching. In some embodiments, a conductive material is formed in the third opening to form the first transistor contact 329a. In some embodiments, the conductive material comprises at least one of metal, metalloid, etc. To form the first gate contact 327a, a fourth opening is formed through the third dielectric layer 326 and the second dielectric layer 324 to expose at least some of the first gate electrode 320a, according to some embodiments. In some embodiments, the fourth opening is formed by etching. In some embodiments, a conductive material is formed in the fourth opening to form the first gate contact 327a. In some embodiments, the conductive material comprises at least one of metal, metalloid, etc.

To form the third portion contact 328c, a fifth opening is formed through the third dielectric layer 326, the second dielectric layer 324, and the first dielectric layer 314 to expose at least some of the fourth silicide portion 312d, according to some embodiments. In some embodiments, the fifth opening is formed by etching. In some embodiments, a conductive material is formed in the fifth opening to form the third portion contact 328c. In some embodiments, the conductive material comprises at least one of metal, metalloid, etc. To form the second transistor contact 329b, a sixth opening is formed through the third dielectric layer 326 to expose at least some of the second active area 322*b*, according to some embodiments. In some embodiments, the sixth opening is formed by etching. In some embodiments, a conductive material is formed in the sixth opening to form the second transistor contact 329*b*. In some embodiments, the conductive material comprises at least one of metal, metalloid, etc. To form the second gate contact 327*b*, a seventh opening is formed through the third dielectric layer 326 and the second dielectric layer 324 to expose at least some of the second gate electrode 320*b*, according to some embodiments. In some embodiments, the seventh opening is formed by etching. In some embodiments, a conductive material is formed in the seventh opening to form the second gate contact 327*b*. In some embodiments, the conductive material comprises at least one of metal, metalloid, etc.

To form the fourth portion contact 328*d*, an eighth opening is formed through the third dielectric layer 326, the second dielectric layer 324, and the first dielectric layer 314 to expose at least some of the sixth silicide portion 312*f*, according to some embodiments. In some embodiments, the eighth opening is formed by etching. In some embodiments, a conductive material is formed in the eighth opening to form the fourth portion contact 328*d*. In some embodiments, the conductive material comprises at least one of metal, metalloid, etc. To form the third transistor contact 329*c*, a ninth opening is formed through the third dielectric layer 326 to expose at least some of the third active area 322*c*, according to some embodiments. In some embodiments, the ninth opening is formed by etching. In some embodiments, a conductive material is formed in the ninth opening to form the third transistor contact 329*c*. In some embodiments, the conductive material comprises at least one of metal, metalloid, etc. To form the third gate contact 327*c*, a tenth opening is formed through the third dielectric layer 326 and the second dielectric layer 324 to expose at least some of the third gate electrode 320*c*, according to some embodiments. In some embodiments, the tenth opening is formed by etching. In some embodiments, a conductive material is formed in the tenth opening to form the third gate contact 327*c*. In some embodiments, the conductive material comprises at least one of metal, metalloid, etc.

According to some embodiments, the first transistor contact 329*a* is connected to the first gate contact 327*a*. In some embodiments, the second conductive portion 308*b*, the first nanowire 310*a*, the first gate 321*a*, and the first active area 322*a* connected to the first gate 321*a* forms a first diode connected transistor. In some embodiments, the first diode connected transistor is connected to the first conductive portion 308*a*. In some embodiments, the first diode connected transistor is connected to the third portion contact 328*c*. In some embodiments, the second transistor contact 329*b* is connected to the second gate contact 327*b*. In some embodiments, the third conductive portion 308*c*, the second nanowire 310*b*, the second gate 321*b*, and the second active area 322*b* connected to the second gate 321*b* forms a second diode connected transistor. In some embodiments, the second diode connected transistor connected to the first conductive portion 308*a*. In some embodiments, the first diode connected transistor is connected to the first conductive portion 308*a* through the second diode connected transistor. In some embodiments, the second diode connected transistor is connected to the fourth portion contact 328*d*. In some embodiments, the third transistor contact 329*c* is connected to the third gate contact 327*c*. In some embodiments, the fourth conductive portion 308*d*, the third nanowire 310*c*, the third gate 321*c*, and the third active area 322*c* connected to the third gate 321*c* forms a third diode connected transistor.

In some embodiments, the third diode connected transistor is connected to the first conductive portion 308*a*. In some embodiments, the first diode connected transistor and the second diode connected transistor are connected to the first conductive portion 308*a* through the third diode connected transistor. In some embodiments, the third diode is connected transistor is connected to the first portion contact 328*a* via an active area connection 339. In some embodiments, the input contact 328*b* is connected to a first source 330. In some embodiments, the first source 330 comprises at least one of an I/O port and a voltage supply. In some embodiments, the voltage supply comprises at least one of a VSS and a VDD. In some embodiments, the VDD comprises a voltage greater than 0V. In some embodiments, the VSS comprises a voltage about equal to 0V. In some embodiments, the I/O port comprises a connection to an outside voltage source. In some embodiments, at least one of the first gate 321*a*, the second gate 321*b*, and the third gate 321*c* regulates or governs the amount of current going through at least one of the first nanowire 310*a*, the second nanowire 310*b*, and the third nanowire 310*c* when a current threshold is reached. In some embodiments, the current threshold comprises a trigger current for the ESD circuit 336, such that meeting the current threshold causes excess current to travel to the ESD circuit 336. In some embodiments, when the current threshold is met, such as during an ESD event, the excess current bypasses at least one of the first diode connected transistor, the second diode connected transistor, and the third diode connected transistor and travels through the second well 304*b* and the first well 304*a* to the ESD circuit 336. In some embodiments, the ESD circuit 336 comprises a SCR device 236 as illustrated in FIG. 15. In some embodiments, such as where a trigger circuit is comprised within the ESD circuit 336, the excess current travels through second conductive portion 308*b*, the second well 304*b* and the first well 304*a* to the ESD circuit 336.

According to some embodiments, such as when an ESD event occurs, the voltage trigger source 132, 232 or a current threshold triggers the gate(s) 121, 221, 321*a*-321*c* to regulates or governs the amount of current that travels through the first nanowire 110, 210, 310*a*, the second nanowire 310*b*, or the third nanowire 310*c*. In some embodiments, when the gate(s) 121, 221, 321*a*-321*c* are triggered a moderate amount of current goes through at least one of the first nanowire 110, 210, 310*a*, the second nanowire 310*b*, and the third nanowire 310*c*. In some embodiments, excess current from the ESD event travels from the second conductive portion 108*b*, 208*b*, 308*b* through the second well 104*b*, 204*b*, 304*b* and the first well 104*a*, 204*a*, 304*a* to the ESD circuit 136, 236, 336 bypassing at least one of the first nanowire 110, 210, 310*a*, the second nanowire 310*b*, and the third nanowire 310*c*. In some embodiments, by having the excess current bypass at least one of the first nanowire 110, 210, 310*a*, the second nanowire 310*b*, and the third nanowire 310*c* a functional lifetime of the nanowire(s) 110, 210, 310*a*-310*c* is increased as compared to a device that does not have a mechanism that bypasses or shunts excess current away from a nanowire during an ESD event. In some embodiments, having the excess current bypass at least one of the first nanowire 110, 210, 310*a*, the second nanowire 310*b*, and the third nanowire 310*c* increases an ESD discharge capability as compared to a semiconductor device that does not have a mechanism that bypasses or shunts current away from a nanowire and send excess current to the ESD circuit. In some embodiments, the ESD circuit is connected to ground to disperse the excess current.

According to some embodiments, a semiconductor device comprises a first conductive portion on a first side of a first shallow trench isolation (STI) region. In some embodiments, the first conductive portion is formed within a first well having a first conductivity type. In some embodiments, the first conductive portion has the first conductivity type. In some embodiments, the first conductive portion is connected to an electro static discharge (ESD) circuit. In some embodiments, a second conductive portion is on a second side of the first STI region. In some embodiments, the second conductive portion is formed within a second well having a second conductivity type. In some embodiments, the second conductive portion has the first conductivity type and is connected to a first nanowire and at least one of an input output (I/O) port and a voltage supply.

According to some embodiments, a semiconductor device comprises a first conductive portion on a first side of a first shallow trench isolation (STI) region, the first conductive portion formed within a first well having a first conductivity type. In some embodiments, the first conductive portion has the first conductivity type. In some embodiments, the first conductive portion is connected to an electro static discharge (ESD) circuit. In some embodiments, a second conductive portion is on a second side of the first STI region. In some embodiments, the second conductive portion is formed within a second well having a second conductivity type. In some embodiments, the second conductive portion has the first conductivity type and is connected to a first nanowire and at least one of an input output (I/O) port and a voltage supply. In some embodiments, a third conductive portion is on a second side of a second STI region where the second conductive portion is on a first side of the second STI region. In some embodiments, the third conductive portion is formed within a third well. In some embodiment, the third well has the first conductivity type. In some embodiments, the third conductive potion has the first conductivity type and is connected to at least one of the I/O port and the voltage supply.

According to some embodiments, a semiconductor device comprises a first conductive portion on a first side of a first shallow trench isolation (STI) region. In some embodiments, the first conductive portion is formed within a first well having a first conductivity type. In some embodiments, the first conductive portion has the first conductivity type. In some embodiments, the first conductive portion is connected to an electro static discharge (ESD) circuit. In some embodiments, a first diode connected transistor is on a second side of the first STI region. In some embodiments, the first diode connected transistor comprises a second conductive portion formed within a second well having a second conductivity type, the second conductive portion having the first conductivity type, a first nanowire is connected to the second conductive portion, a first gate surrounding the first nanowire, and a first active area is over the first nanowire and connected to the first gate. In some embodiments, the first active area has the first conductivity type and is connected to the first conductive portion.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, and deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
a first conductive portion on a first side of a first shallow trench isolation (STI) region, the first conductive portion formed within a first well having a first conductivity type, the first conductive portion having the first conductivity type;
a second conductive portion on a second side of the first STI region, the second conductive portion formed within a second well having a second conductivity type, the second conductive portion having the first conductivity type;
a first nanowire defining a channel region and in contact with the second conductive portion; and
a first active area overlying the first nanowire, wherein:
the first active area is directly coupled to the first conductive portion through a non-grounded electrical pathway; and
the second conductive portion is coupled to at least one of an input output (I/O) port or a voltage supply.

2. The semiconductor device of claim 1, the voltage supply comprising at least one of a VDD and a VSS.

3. The semiconductor device of claim 1, comprising a third conductive portion on a first side of a second STI region where the second conductive portion is on a second side of the second STI region, the third conductive portion formed within the second well and having the second conductivity type, the third conductive portion coupled to at least one of the I/O port or the voltage supply.

4. The semiconductor device of claim 1, the first active area having the first conductivity type.

5. The semiconductor device of claim 1, comprising:
a dielectric layer overlying the second conductive portion; and
a high-k gate dielectric overlying the dielectric layer and in contact with the first nanowire.

6. The semiconductor device of claim 1, comprising:
a gate surrounding the first nanowire; and
a gate contact coupled to the gate and to a voltage trigger source.

7. A semiconductor device comprising:
a first conductive portion on a first side of a first shallow trench isolation (STI) region, the first conductive portion formed within a first well having a first conductivity type, the first conductive portion having the first conductivity type;
a second conductive portion on a second side of the first STI region, the second conductive portion formed within a second well having a second conductivity type, the second conductive portion having the first conductivity type and coupled to a first nanowire and at least one of an input output (I/O) port or a voltage supply;
a third conductive portion on a first side of a second STI region where the second conductive portion is on a second side of the second STI region, the third conductive portion formed within a third well having the first conductivity type, the third conductive portion having the first conductivity type and coupled to at least one of the I/O port or the voltage supply;
a fourth conductive portion on a first side of a third STI region where the first conductive portion is on a second side of the third STI region, the fourth conductive portion formed within the first well, the fourth conductive portion having the second conductivity type and coupled to at least one of the I/O port or the voltage supply; and
a fifth conductive portion on a first side of a fourth STI region where the fourth conductive portion is on a second side of the fourth STI region, the fifth conductive portion formed within the first well, the fifth conductive portion having the first conductivity type and coupled to at least one of the I/O port or the voltage supply.

8. The semiconductor device of claim 7, the voltage supply comprising at least one of a VDD or a VSS.

9. The semiconductor device of claim 7, comprising a sixth conductive portion on a first side of a fifth STI region where the third conductive portion is on a second side of the fifth STI region, the sixth conductive portion formed within the third well, the sixth conductive portion having the second conductivity type and coupled to at least one of the I/O port or the voltage supply.

10. The semiconductor device of claim 7, comprising a first active area over the first nanowire, the first active area having the first conductivity type.

11. The semiconductor device of claim 10, the first active area coupled to the first conductive portion through a non-grounded electrical pathway.

12. The semiconductor device of claim 7, comprising:
a gate surrounding the first nanowire; and
a gate contact coupled to the gate and a voltage trigger source.

13. The semiconductor device of claim 7, comprising:
a dielectric layer overlying the second conductive portion; and
a high-k gate dielectric overlying the dielectric layer and in contact with the first nanowire.

14. The semiconductor device of claim 7, comprising:
a first active area overlying the first nanowire and having the first conductivity type, the first active area coupled to a gate surrounding the first nanowire through a first electrical pathway.

15. A semiconductor device comprising:
a first conductive portion on a first side of a first shallow trench isolation (STI) region, the first conductive portion formed within a first well having a first conductivity type, the first conductive portion having the first conductivity type;
a first diode connected transistor on a second side of the first STI region, the first diode connected transistor comprising:
a second conductive portion formed within a second well having a second conductivity type, the second conductive portion having the first conductivity type;
a first nanowire in contact with the second conductive portion;
a first gate surrounding the first nanowire; and
a first active area over the first nanowire and having the first conductivity type; and
a third conductive portion formed within the second well and on a first side of a second STI region where the first diode connected transistor is on a second side of the second STI region, wherein:
the third conductive portion has the first conductivity type;
the first active area is coupled to the first gate through a first electrical pathway; and
the first active area is coupled to the third conductive portion through a second electrical pathway.

16. The semiconductor device of claim 15, comprising a second diode connected transistor on the first side of the second STI region, the second diode connected transistor comprising:
- the third conductive portion;
- a second nanowire in contact with the third conductive portion;
- a second gate surrounding the second nanowire; and
- a second active area over the second nanowire and having the first conductivity type, the second active area coupled to the second gate through a third electrical pathway.

17. The semiconductor device of claim 16, comprising a third diode connected transistor on a first side of a third STI region, where the third conductive portion is on a second side of the third STI region, the third diode connected transistor comprising:
- a fourth conductive portion formed within the second well, the fourth conductive portion having the first conductivity type, the fourth conductive portion coupled the second active area through a fourth electrical pathway;
- a third nanowire in contact with the fourth conductive portion;
- a third gate surrounding the third nanowire; and
- a third active area over the third nanowire and having the first conductivity type, the third active area coupled to the third gate through a fifth electrical pathway.

18. The semiconductor device of claim 17, the third active area coupled to the first conductive portion through a sixth electrical pathway.

19. The semiconductor device of claim 15, comprising:
- a dielectric layer overlying the second conductive portion; and
- a high-k gate dielectric overlying the dielectric layer and in contact with the first nanowire.

20. The semiconductor device of claim 15, the second conductive portion coupled to at least one of an input output (I/O) port or a voltage supply.

* * * * *